(12) United States Patent
Ono et al.

(10) Patent No.: US 8,102,695 B2
(45) Date of Patent: Jan. 24, 2012

(54) SEMICONDUCTOR DEVICE

(75) Inventors: Kazuo Ono, Kodaira (JP); Riichiro Takemura, Tokyo (JP); Tomonori Sekiguchi, Tama (JP)

(73) Assignee: Hitachi, Ltd., Tokyo (JP)

( * ) Notice: Subject to any disclaimer, the term of this patent is extended or adjusted under 35 U.S.C. 154(b) by 346 days.

(21) Appl. No.: 12/430,067

(22) Filed: Apr. 25, 2009

(65) Prior Publication Data

US 2009/0273961 A1 Nov. 5, 2009

(30) Foreign Application Priority Data

May 2, 2008 (JP) ................................. 2008-120466

(51) Int. Cl.
*G11C 11/00* (2006.01)
(52) U.S. Cl. ................... 365/148; 365/51; 365/189.011; 365/163
(58) Field of Classification Search .................... 365/51, 365/148, 189.011, 163
See application file for complete search history.

(56) References Cited

U.S. PATENT DOCUMENTS

| 7,443,721 B2 * | 10/2008 | Kurotsuchi et al. | 365/163 |
| 7,453,722 B2 * | 11/2008 | Choi et al. | 365/163 |
| 2003/0043620 A1 | 3/2003 | Ooishi | |

FOREIGN PATENT DOCUMENTS

JP 2003-077267 A 3/2003

OTHER PUBLICATIONS

B. Gleixner et al., "Data Retention Characterization of Phase-Change Memory Arrays", Proc. IRPS 2007, pp. 542-546.
M. Durlam et al., "A 0.18μm 4MB Toggling MRAM", Proc. IEDM 2003, pp. 34.6.1-34.6.3.
S. Karg et al., "Nanoscale Resistive Memory Device Using $SrTiO_3$ Films", Non-Volatile Semiconductor Memory Workshop, 2007 $22^{nd}$ IEEE Aug. 26-30, 2007, pp. 68-70.
Gilbert et al., "An Embeddable Multilevel-Cell Solid Electrolyte Memory Array", Journal of Solid-State Circuits, vol. 42, No. 6, Jun. 2007, pp. 1383-1391.

* cited by examiner

*Primary Examiner* — Tuan T Nguyen
*Assistant Examiner* — Toan Le
(74) *Attorney, Agent, or Firm* — Miles & Stockbridge P.C.

(57) ABSTRACT

A technique for increasing rewriting current without increasing a power supply voltage and also reducing location dependency inside a memory array of a resistive state after the rewriting is provided in a resistance change memory in which the resistance value of a memory cell changes between logical values "1" and "0". In the resistance change memory, bit lines are formed into a layered structure, the bit line select switches for connecting to the global bit line are provided at both ends of the local bit line, and a control method of the bit line select switches is changed in the writing and the reading, thereby realizing the optimum array configurations for each of them. More specifically, in the writing and the reading, two current paths are provided in parallel by turning ON the bit line select switches simultaneously.

19 Claims, 35 Drawing Sheets

$I = V/(RS1+RM+RS2)$
$V = V1-V2$ $I = V/(RP+RM)$
$RP = RS1+RS2$

IW=V/(RP+RM)
V=V1−V2
RP1=RS1+RS4
RP2=RS1+RS2+RS3+RS4

SEMICONDUCTOR DEVICE

CROSS-REFERENCE TO RELATED APPLICATION

The present application claims priority from Japanese Patent Application No. JP 2008-120466 filed on May 2, 2008, the content of which is hereby incorporated by reference into this application.

TECHNICAL FIELD OF THE INVENTION

The present invention relates to a semiconductor device having a resistance change memory cell, and more particularly to a technique for realizing highly reliable reading and writing by reducing the parasitic resistance component and suppressing the variation of the resistance component in an array (hereinafter, referred to also as memory array and memory cell array).

BACKGROUND OF THE INVENTION

The scaling down of the manufacturing rule has been advanced in order to achieve higher integration in a dynamic random access memory (DRAM), but it has become difficult to manufacture a capacitor for providing sufficient signals. Thus, a resistance change memory cell in which a resistance change element is used in place of the capacitor to form a memory cell and the magnitude of a resistance value is made to correspond to logic information "1" and "0" has been contrived.

As an example of the resistance change memory, a phase change memory, a magnetic RAM (MRAM), a resistive RAM (ReRAM) and a solid electrolyte memory have been contrived. For example, the phase change memory is disclosed in Proc. IRPS 2007, pp 542-546, "Data Retention Characterization of Phase-Change Memory Arrays" (Non-Patent Document 1), the MRAM is disclosed in Japanese Patent Application Laid-Open Publication No. 2003-77267 (Patent Document 1) and Proc. IEDM 2003, pp 34.6.1-34.6.3, "A 0.18 μm 4 Mb toggling MRAM" (Non-Patent Document 2), the ReRAM is disclosed in Non-Volatile Semiconductor Memory Workshop, 2007 22nd IEEE 26-30 Aug. 2007, pp 68-70, "Nanoscale Resistive Memory Device Using $SrTiO_3$ Films" (Non-Patent Document 3), and the solid electrolyte memory is disclosed in Journal of Solid-State Circuits, vol. 42, No. 6, pp 1383-1391, June 2007. "An Embeddable Multilevel-Cell Solid Electrolyte Memory Array" (Non-Patent Document 4), respectively.

SUMMARY OF THE INVENTION

Meanwhile, as a result of the examination conducted on the resistance change memories disclosed in the Patent Document 1 and the Non-Patent Documents 1 to 4 by the present inventors, the following has been revealed.

As shown in FIG. 2A, a phase change memory has a structure in which a chalcogenide film is sandwiched between an upper electrode UL and a lower electrode LL. The chalcogenide film is controlled into an amorphous state or a crystalline state by the heat transmitted from the LL. The heat generation efficiency can be enhanced by reducing the area of the LL. When the chalcogenide film directly above the LL is in an amorphous state, the resistance between the UL and the LL is high, and when it is in a crystalline state, the resistance between the UL and the LL is low. In FIG. 2B, the potential difference V1 between the UL and the LL is plotted on a horizontal axis and the current I1 flowing from the LL to the UL is plotted on a vertical axis, and the current-voltage characteristics of the phase change memory are shown. The direction of V1 is the same and the magnitude thereof differs between the rewriting from a low resistive state (ON state) to a high resistive state (OFF state) and the rewriting from an OFF state to an ON state. For the change from the ON state to the OFF state, a high current is required.

A MRAM and a ReRAM are shown in FIG. 3, and two types of solid electrolyte memories are shown in FIG. 4. The current-voltage characteristics of all the memories shown FIG. 3 and FIG. 4 are shown in FIG. 5. In FIG. 5, the horizontal axis of the graph represents the voltage V1 between the UL and the LL, and the vertical axis represents the current I1 flowing from the UL to the LL The voltage application direction differs between the rewriting from an OFF state to an ON state and the rewriting from an ON state to an OFF state. For example, when the current is caused to flow from the UL to the LL, it is in an ON state, and when the current is caused to flow from the LL to the UL, it is in an OFF state.

As shown in FIG. 3A, the MRAM is a memory which has a structure in which a magnetic layer, a tunnel layer and a magnetic layer are sandwiched between the UL and the LL and uses the magnitude of the tunnel current flowing between the UL and the LL for the recording. When the magnetization directions of two magnetic layers sandwiching the tunnel layer are parallel to each other, it is in an ON state, and when they are antiparallel, it is in an OFF state. In the rewriting, a magnetic field is generated in the vicinity of the MRAM device, thereby inverting the magnetization in the magnetic layer. It is characterized in that the electric power required for the rewriting is large because the high current is required for generating the magnetic field. As shown in FIG. 3B, for example, the ReRAM has a structure in which a perovskite manganese oxide and others are sandwiched between the UL and the LL. For example, the ReRAM uses the change of the resistance value in accordance with the change of the defect level in the material for the recording. When electrons are not trapped in the defect level, it is in an OFF state, and when they are trapped, it is in an ON state. The rewriting current is high, and the ON and OFF states are changed depending on the magnitude of the rewriting current.

As shown in FIG. 4A, a solid electrolyte memory has a structure in which a solid electrolyte film EL which is the compound of oxygen (O), sulfur (S), selenium (Se) and tellurium (Te) is sandwiched between the UL and the LL. A metallic conducting path is formed in the solid electrolyte by the electric filed in the direction from the UL to the LL, thereby achieving the ON state. The conducting path is caused to disappear by the electric field in the direction from the LL to the UL, thereby achieving the OFF state. Information is recorded by using the magnitude of the resistance value between the UL and LL. FIG. 4B shows another structure of the solid electrolyte memory. Unlike the solid electrolyte memory shown in FIG. 4A, it has a structure in which two or more layers of solid electrolyte films EL1 and EL2 are sandwiched between the UL and the LL. FIG. 4B shows the structure including two layers of electrolyte films as one example. Metallic ions are supplied from the solid electrolyte film EL1 to the solid electrolyte film EL2 by the electric field in the direction from the UL to the LL, thereby achieving the ON state, and the metallic ions are returned from the EL2 to the EL1 by the electric filed in the direction from the LL to the UL, thereby achieving the OFF state. This structure is superior in controllability of metallic ions compared with the structure of FIG. 4A. Operations are executed in a small area at an atomic level in both the structures shown in FIG. 4A and FIG. 4B, and they have the characteristics of being excellent in scaling. Since the resistance value of the ON state is low, a high current is required for achieving the OFF state. Further, the ON and OFF states are changed depending on the magnitude of the rewriting current.

As described above, various types of resistance change memories which carry out the rewriting by causing the current to flow have been contrived. However, a high current is required at the time of writing and ON and OFF states are changed depending on the magnitude of the rewriting current in most of the resistance change memories.

FIG. 6 shows a first problem to be solved by the present invention. FIG. 6A shows a circuit and a current direction in the case of rewriting a resistance change memory cell MC. A driver V1, a parasitic load RS1, a MC, a parasitic load RS2 and a driver V2 are connected in series, and the rewriting is performed by causing the current I to flow from the V1 to the V2. A parasitic load RP between the driver V1 and the driver V2 is RS1+RS2. FIG. 6B shows a rewriting current I (vertical axis) with respect to RP (horizontal axis). An IC is the lowest current required for operating the MC. In order to operate the MC, the current I equal to or higher than the IC is required. For that purpose, however, the PR has to be reduced to the value within the area shown as target in FIG. 6B. For the reduction of the RP, the RS1 and the RS2 have to be reduced. Particularly, when the MC is in an ON state, since a resistance RM of the memory cell is low, a ratio of RS1+RS2 in the whole resistance components in the current path from the V1 to the V2 increases. Hence, particularly in the rewriting from the ON state to the OFF state, it is important to reduce RS1+ RS2. In a large-scale memory array, a long distance wiring is required for the current path from the driver to the memory cell. However, the width of the wiring is reduced with the increase of the integration, and the wiring resistance is increased. Although it is possible to increase the operation voltage to obtain the current necessary for writing, the power consumption increases, so that the reliability of the memory chip is likely to decrease due to heat generation. It is important to reduce the parasitic load in the current path not only by the material, but also by an array configuration and a circuit configuration.

FIG. 7 shows a second problem to be solved by the present invention. FIG. 7A shows a circuit for rewriting memory cells MC1 and MC2 into a low resistive state (ON state). The driver V1, a series load (parasitic load) RS1, a MC1, a series load RS4 and the driver V2 are connected in series. Further, a series load RS2, a MC2, and a series load RS3 are connected in series so as to be parallel to the MC1. A parasitic load RP1 is represented by RS1+RS4, and a parasitic load RP2 is represented by RS1+RS2+RS3+RS4. The current when the MC1 is rewritten by causing the current to flow from the V1 to the V2 is taken as IW1 and the resistance of the MC1 is taken as RM1, and the current when the MC2 is rewritten is taken as IW2 and the resistance of the MC2 is taken as RM2. FIG. 7B shows the relation between IW (horizontal axis) and RP (vertical axis) and the relation between IW (horizontal axis) and RM (vertical axis). When the rewriting voltage V is constant, the IW changes depending on the magnitude of the parasitic resistance. The ON current of the MC when the magnitude of the parasitic resistance is RP1 is ION1, and the ON current of the MC when the magnitude of the parasitic resistance is RP2 is ION2. Now assume that V=V1−V2, since IW=V/(RP+ RM), ION=V/(RP+RON), and ION becomes a function of the RP. Most of the resistance change memories have a characteristic that the ON resistance RON changes by the ION. For example, it is reported that the solid electrolyte memory has such a characteristic (Non-Patent Document 4). In other words, the ON resister after the rewriting from the high resistive state (OFF state) to the ON state is changed depending on the magnitude of the parasitic resistance component (parasitic load) RP.

When a memory array is to be fabricated, it is predicted that the location dependency inside the array of the parasitic resistance is increased as the scale of the array becomes larger. More specifically, the memory cell disposed at a close distance from the driver has a low parasitic resistance, and the memory cell disposed at a distance far from the driver has a high parasitic resistance. As a result, there arises a problem that the resistance value changes depending on the location of the memory cell in the array even in the same ON state. This leads to a false reading and the reduction of a reading margin. When the problem is to be solved by applying ingenuity to a sense amplifier, for example, a method of disposing a plurality of references and selectively using them according to the address is conceivable. However, in this case, the sense amplifier becomes complicated, and the integration degree of the memory is decreased.

As described above, when the large scale memory array is fabricated by the resistance change memory, the reduction of the parasitic resistance component for obtaining the current necessary for writing and the reduction of the location dependency of the parasitic resistance component inside the array are the desired conditions to be achieved.

Therefore, a representative object of the present invention is to provide a technique capable of increasing the rewriting current without increasing the power supply voltage, and at the same time, reducing the location dependency inside the memory array of a resistive state after the rewriting, in the resistance change memory in which the resistance value of the memory cell changes between the logical values "1" and "0".

The above and other objects and novel characteristics of the present invention will be apparent from the description of this specification and the accompanying drawings.

The typical ones of the inventions disclosed in this application will be briefly described as follows.

More specifically, the outline of the representative embodiment of the present invention is characterized in that bit lines are formed into a layered structure and switches for connecting to a global bit line are provided at both ends of the local bit lines in a resistance change memory. Further, it is characterized in that a controlling method of the switch is changed in the reading and the writing, thereby realizing an optimum array configuration for both the reading and the writing.

The effects obtained by typical one of the inventions disclosed in this application will be briefly described below.

More specifically, as the advantages obtained by the representative embodiment, the rewriting current can be increased without increasing the power supply voltage, and at the same time, the location dependency inside the memory array of a resistive state after the writing can be reduced in the resistance change memory in which the resistance value of the memory cell changes between the logical values "1" and "0".

DESCRIPTIONS OF THE PREFERRED EMBODIMENTS

Hereinafter, embodiments of the present invention will be described in detail with reference to the accompanying drawings. Note that components having the same function are denoted by the same reference numbers throughout the drawings for describing the embodiments, and the repetitive description thereof will be omitted.

First Embodiment

A semiconductor device according to a first embodiment of the present invention will be described with reference to FIG. 1 and FIG. 8 to FIG. 22.

Figure 1:
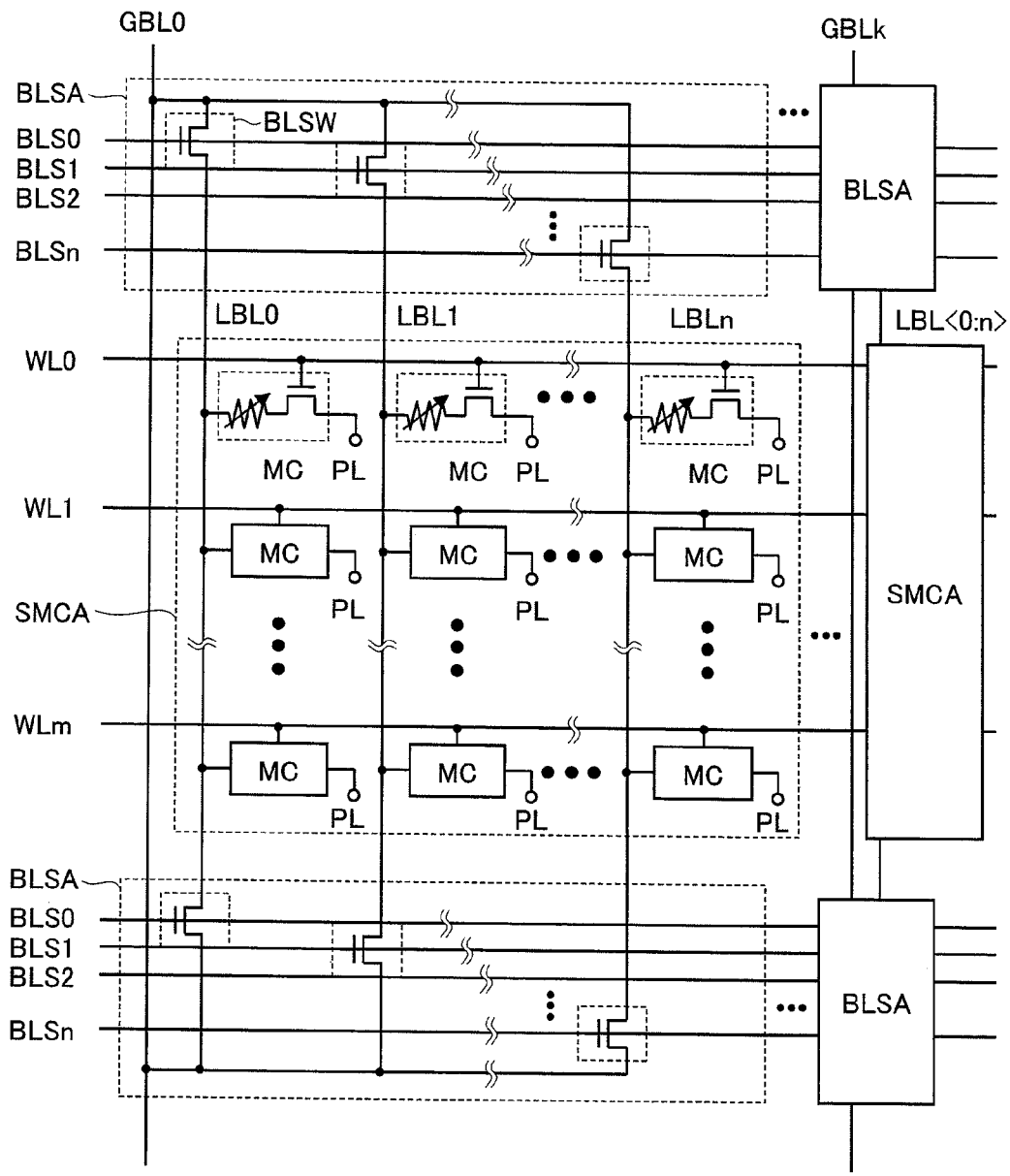
FIG. 1 is a view showing one example of the configuration of a memory cell array in a semiconductor device according to a first embodiment of the present invention.

FIG. 1 shows one example of the configuration of a memory cell array in the semiconductor device according to the first embodiment.

The memory cell array is constituted by disposing sub-memory blocks in an array, and the sub-memory block includes upside and downside bit line select switch arrays BLSA having a plurality of bit line select switches BLSW and a sub-memory cell array SMCA adjacently disposed between the upside and downside bit line select switch arrays BLSA and having a plurality of local bit lines LBL (0 to n), a plurality of word lines WL (0 to m) and a plurality of memory cells MC disposed at intersections of the plurality of word lines WL and the plurality of local bit lines LBL.

The local bit lines LBL are connected to global bit lines GBL (0 to k) in the upside and downside bit line select switch arrays BLSA, and the current flows in the same direction in the writing. The bit line select switches BLSW of the upside and downside bit line select switch arrays BLSA are controlled by bit line select lines BLS (0 to n).

The memory cell MC is constituted of, for example, a select element composed of a MOS transistor and a resistance change element. One end of the select element is connected to a plate PL shared with other memory cells and the other end thereof is connected to the resistance change element. The resistance change element is connected in series between the local bit line LBL and the select element. In this memory cell MC, information is recorded by a resistance change, and information is written by causing the current to flow.

In the following, each line may be described as each signal and each signal may be described as each line. For example, the BLS may be described as the bit line select line or the bit line select signal.

Figure 8:
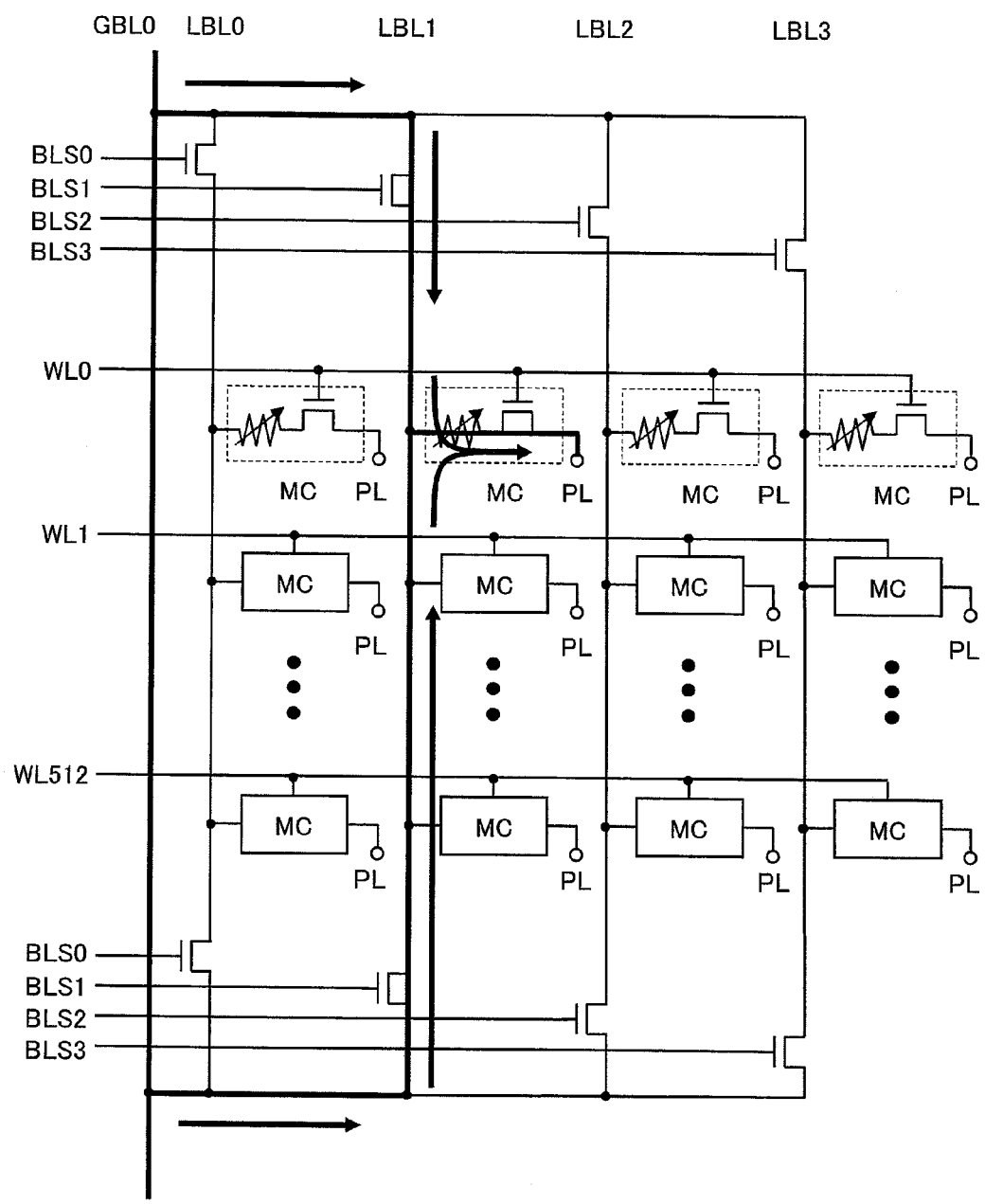
FIG. 8 is a view showing one example of the operation of a memory cell array in the semiconductor device according to the first embodiment of the present invention.

FIG. 8 shows one example of the operation of the memory cell array in the semiconductor device according to the first embodiment.

Figure 2A:
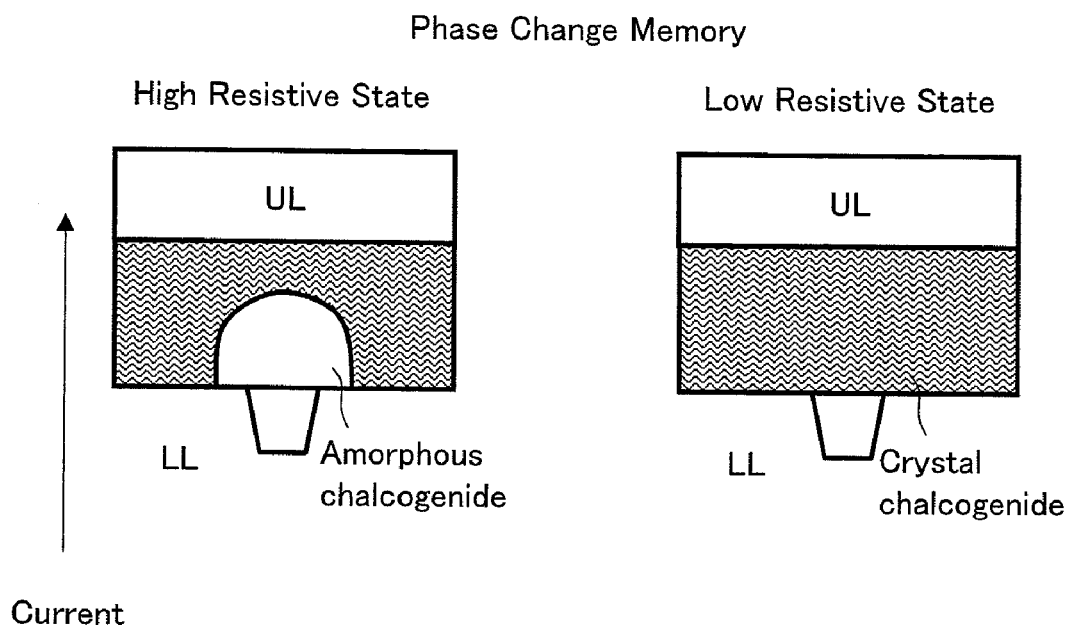
FIG. 2A is a view showing one example of the cross section of a high resistive state and a low resistive state in a general phase change memory.
Figure 3A:
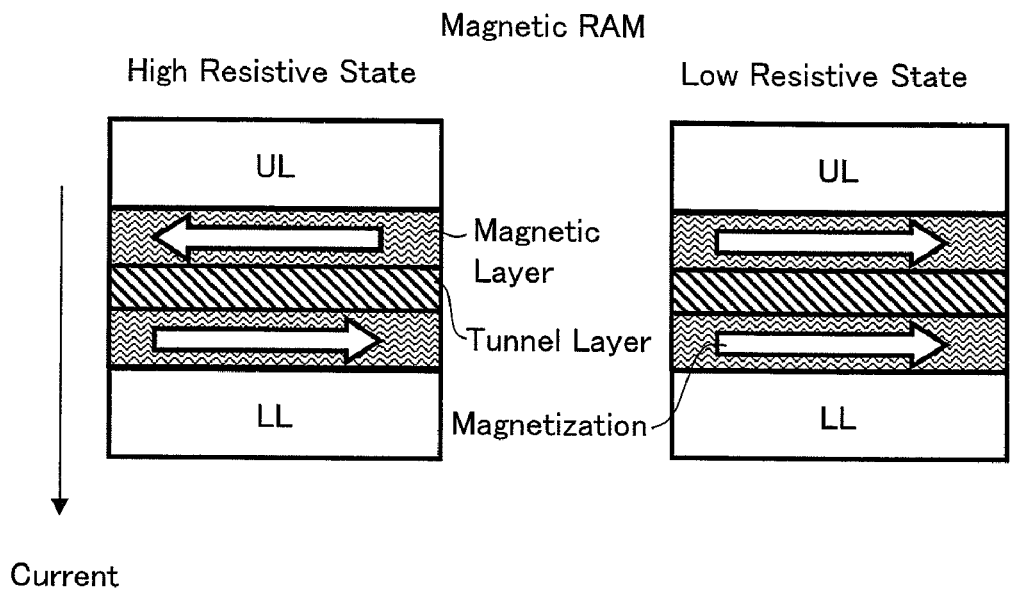
FIG. 3A is a view showing one example of the cross section of a high resistive state and a low resistive state in a general MRAM.
Figure 3B:
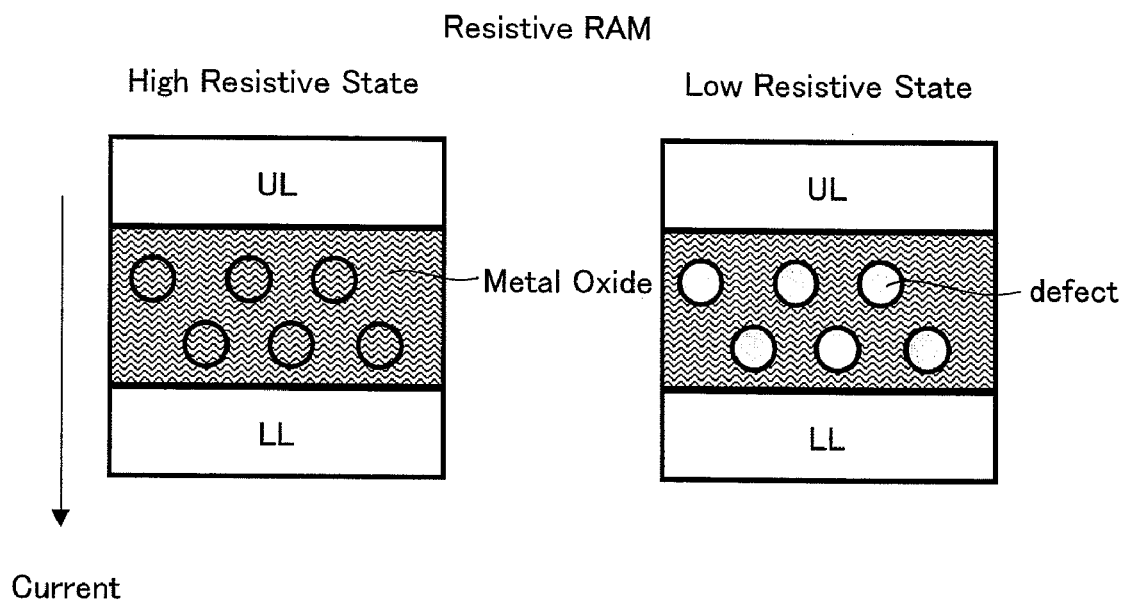
FIG. 3B is a view showing one example of the cross section of a high resistive state and a low resistive state in a general ReRAM.
Figure 4A:
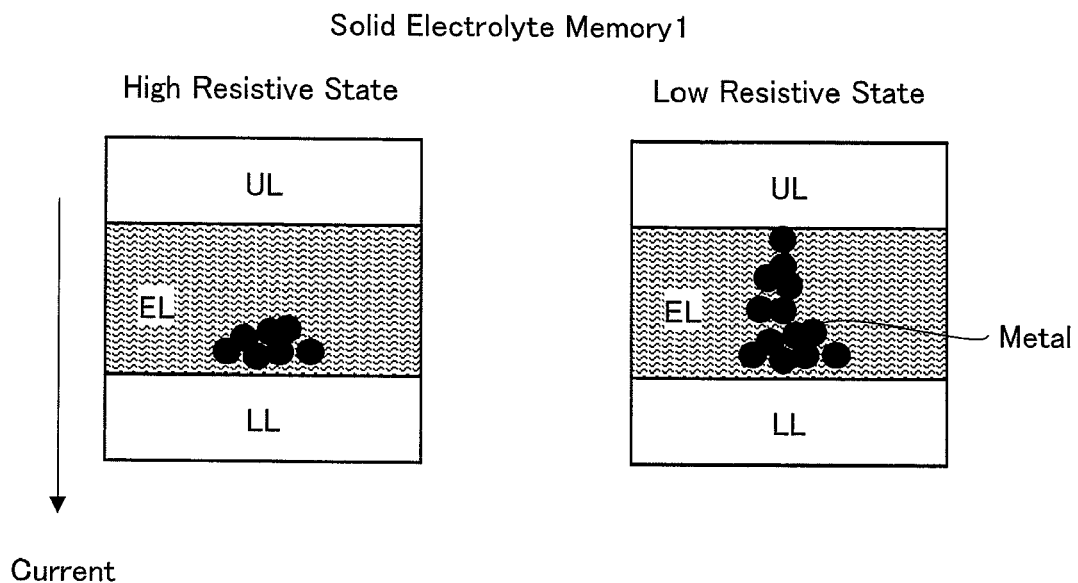
FIG. 4A is a view showing one example of the cross section of a high resistive state and a low resistive state in a general solid electrolyte memory.
Figure 4B:
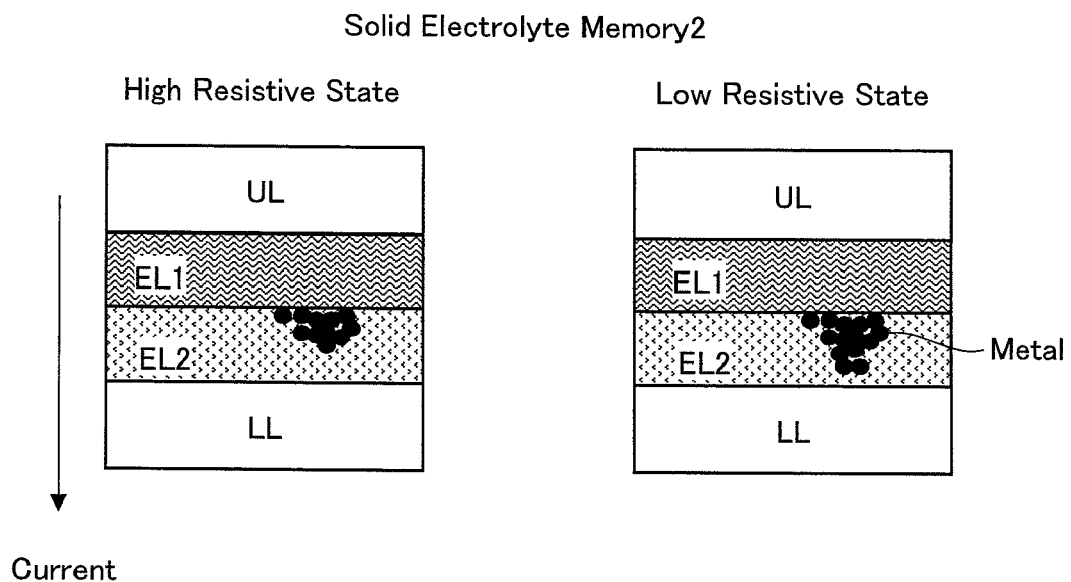
FIG. 4B is a view showing one example of the cross section of a high resistive state and a low resistive state in the case where the recording layer has a two-layer structure in a general solid electrolyte memory.

A thick line of FIG. 8 shows a path of the current flowing into the array when information of the memory cell MC disposed at the intersection of a word line WL0 and a local bit line LBL1 is rewritten (written) from, for example, a logical value "0" (high resistive state) to "1" (low resistive state). The connecting direction of the resistance change element of the MC can be reversed, and in this case, the information is rewritten from the logical value "1" to "0" with the same direction as the rewriting current shown in FIG. 8. Depending on the material used for the MC (shown in FIG. 2 to FIG. 4 as an example), there is a case where the direction of the current to flow is different between the writing and the rewriting (deleting) from the logical value "1" to "0" and a case where the direction of the current is the same between the writing and the deleting. The select element of the MC is constituted of, for example, one MOS transistor, and the source side is connected to the plate PL and the drain is connected to the resistance change element, so that the resistance change element is connected in series between the local bit line LBL1 and the plate PL. Hence, it is possible to take two paths from a global bit line GBL0 described later to the plate PL. The global bit line GBL0 is charged to a higher rewriting potential than the plate PL by a driver circuit. By taking AND logic of the mat select signal and the rewiring enable signal, a bit line select line BLS1 is selected. As a result, the bit line select switches connected to both ends of the local bit line LBL1 are turned ON. The rewriting current flows to the local bit line LBL1 in parallel from the global bit line GBL0 through the bit line select switches connected to both ends of the local bit line LBL1, and then flows to the plate PL through the memory cell MC. Since two current paths are provided in parallel from GBL0 to LBL1, the parasitic resistance component until reaching the MC can be suppressed, and as a result, it is possible to cause the high current necessary for the rewriting to flow to the MC.

In the reading, GBL0 is charged to the reading potential by the driver circuit, and the current is caused to flow in the same current path as the rewriting. In that case, the bit line select line BLS1 is selected from a mat select signal and a read enable signal. The reading current is caused to flow to the MC in parallel through two paths from the global bit line GBL0 to the local bit line LBL1. By causing the reading current to flow from both ends of the local bit line LBL1, the difference in the magnitude of the parasitic resistance component depending on the location of the memory cell MC inside the array is reduced by half as compared with the case where the current is caused to flow from only one end. More specifically, when the reading current is caused to flow from one side of the local bit line, the difference in the parasitic resistance between the memory cell located in the vicinity of the end of the LBL1 having the switch and the memory cell located in the vicinity of the end of the LBL1 having no switch is the largest, and the difference thereof is equivalent to that of one local bit line. On the other hand, when the reading current is caused to flow from both ends of the local bit line LBL1, the difference in the parasitic resistance between the memory cell located at the center of the LBL1 and the memory cell located at the end is the largest, and the difference is equivalent to half of one LBL1. Therefore, as compared with the case where the reading current is caused to flow from only one side, the difference in the magnitude of the parasitic resistance is reduced by half. As a result, the margin in the reading can be increased in the array according to the present invention.

In both cases of the writing and the reading, the two switches for connecting the local bit line LBL1 to the global bit line GBL0 are both selected by the same select line BLS1. Accordingly, a circuit design and control are facilitated as compared with the case where the two switches are respectively selected by separate select lines.

Further, in this layout, the current flows in the direction from the global bit line GBL0 to the plate PL in all the memory cells. Hence, as compared with the case where a plurality of memory cells having different rewriting current directions are provided, the circuit configuration for switches and others is simplified, and the circuit area can be reduced.

Figure 9A:
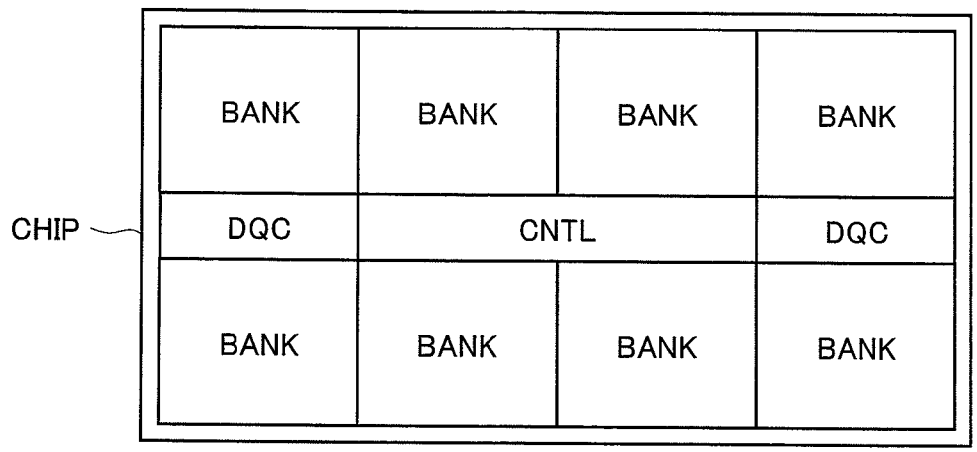
FIG. 9A is a view showing one example of the configuration of the memory chip in the semiconductor device according to the first embodiment of the present invention.
Figure 9B:
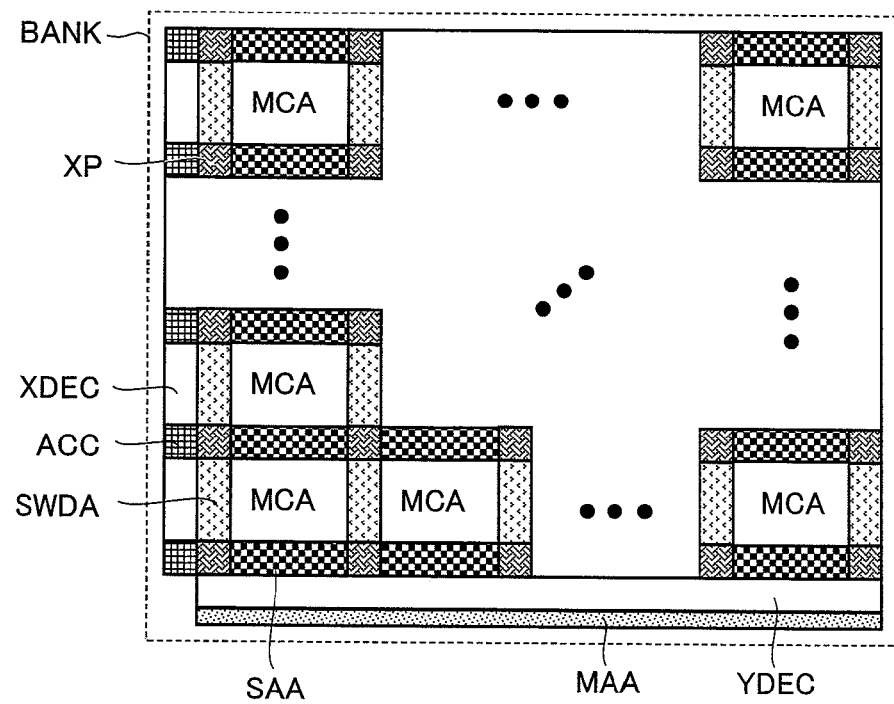
FIG. 9B is a view showing one example of the configuration of a memory bank in FIG. 9A.

In FIG. 9, in the semiconductor device according to the first embodiment, one example of the configuration of a memory chip is shown in FIG. 9A, and one example of the configuration of a memory bank in FIG. 9A is shown in FIG. 9B.

The semiconductor device shown in FIG. 9 is a solid electrolyte memory. The whole configuration of its memory chip CHIP is roughly divided into, for example, a control circuit CNTL, an input-output circuit DQC and a memory bank BANK as shown in FIG. 9A. A clock, an address and a control signal are inputted to the control circuit CNTL from the outside of the memory chip CHIP, so that the determination of the operation mode of the memory chip CHIP, the pre-decoding of the address and others are performed. The input-output circuit DQC is provided with an input-output buffer and others, to which write data is inputted from the outside of the memory chip CHIP, and from which read data is outputted to the outside of the memory chip CHIP.

In the memory bank BANK, for example, a plurality of memory cell arrays MCA are disposed in an array as shown in FIG. 9B, and a sub-word driver column SWDA, a sense amplifier column SAA and a row control circuit XP are disposed around the memory cell array MCA. Further, in the outer periphery of the memory bank BANK, a Y (column) decoder YDEC and a main amplifier column MAA are disposed in parallel to the sense amplifier column SAA, and an X (row) decoder XDEC and an array control circuit ACC are disposed in parallel to the sub-word driver column SWDA.

Figure 10:
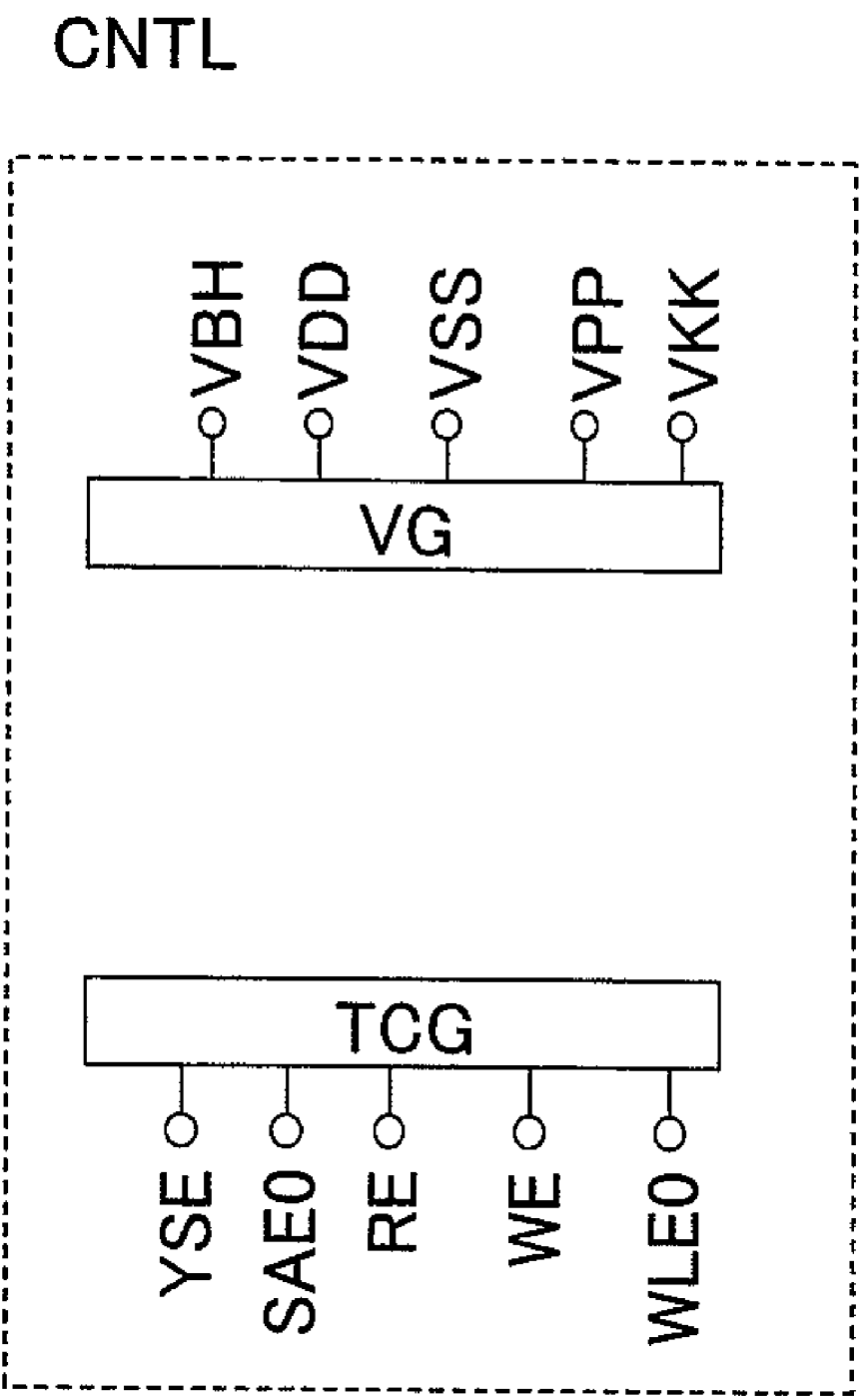
FIG. 10 is a view showing one example of each voltage in a voltage generating circuit and one example of each signal in a timing control signal generating circuit as a part of a control circuit in the semiconductor device according to the first embodiment of the present invention.

FIG. 10 shows one example of each voltage in a voltage generating circuit and one example of each signal in a timing control signal generating circuit as a part of the control circuit CNTL.

For example, in a voltage generating circuit VG, a memory cell writing voltage VBH, a control circuit voltage VDD, a ground voltage VSS, a word line boost voltage VPP and a negative voltage VKK are generated. For example, in a timing control signal generating circuit TCG, a column enable signal YSE, a sense amplifier enable original signal SAE0, a read enable signal RE, a write enable signal WE and a word line enable original signal WLE0 are generated.

Figure 11:
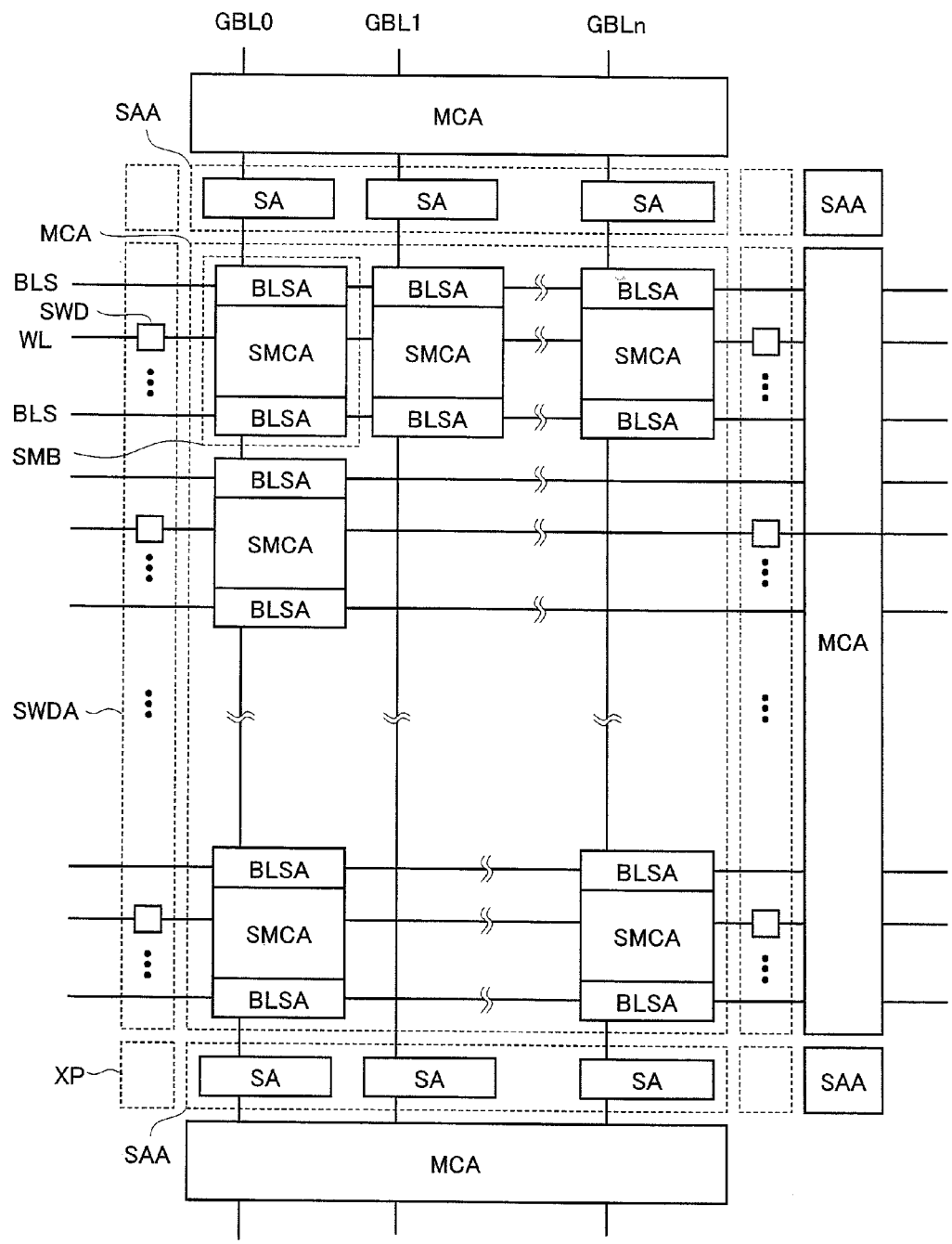
FIG. 11 is a view showing one example of the configuration of the memory cell array and peripheral circuits thereof in the semiconductor device according to the first embodiment of the present invention.

FIG. 11 shows one example of the configuration of the memory cell array MCA and peripheral circuits thereof.

The sense amplifier columns SAA including a plurality of sense amplifiers are adjacently disposed on the upside and downside of the memory cell array MCA, and the sub-word driver columns SWDA including a plurality of sub-word drivers are adjacently disposed on the left and right sides of the MCA. The SAA and the SWDA are shared by the memory cell arrays MCA on the upside and downside and on the left side and right side, so that the chip area can be reduced. The row control circuit XP is disposed in the portion surrounded by the SAA and the SWDA. This row control circuit XP is also shared by the MCA on the upside and downside, so that the chip area can be reduced. The MCA is constituted of sub-memory blocks SMB disposed at desired intersections of a plurality of global bit lines GBL and a plurality of bit line select signals BLS. The sub-memory block SMB is constituted of a sub-memory cell array SMCA and bit line select switch arrays BLSA adjacently disposed on the upside and downside of the SMCA. The sub-memory blocks SMB arranged in the row direction are configured to be selected by the common word line WL and bit line select signal BLS. This has an advantage that the memory cells in the column direction can be simultaneously read at once while reducing the driving of the word line having large power consumption. Although the configuration in which one sense amplifier SA is used for one global bit line GBL has been shown as an example, the configuration in which a plurality of global bit lines share one sense amplifier in order to reduce the chip area is also possible. In this case, a global bit line select circuit block is necessary.

Figure 12:
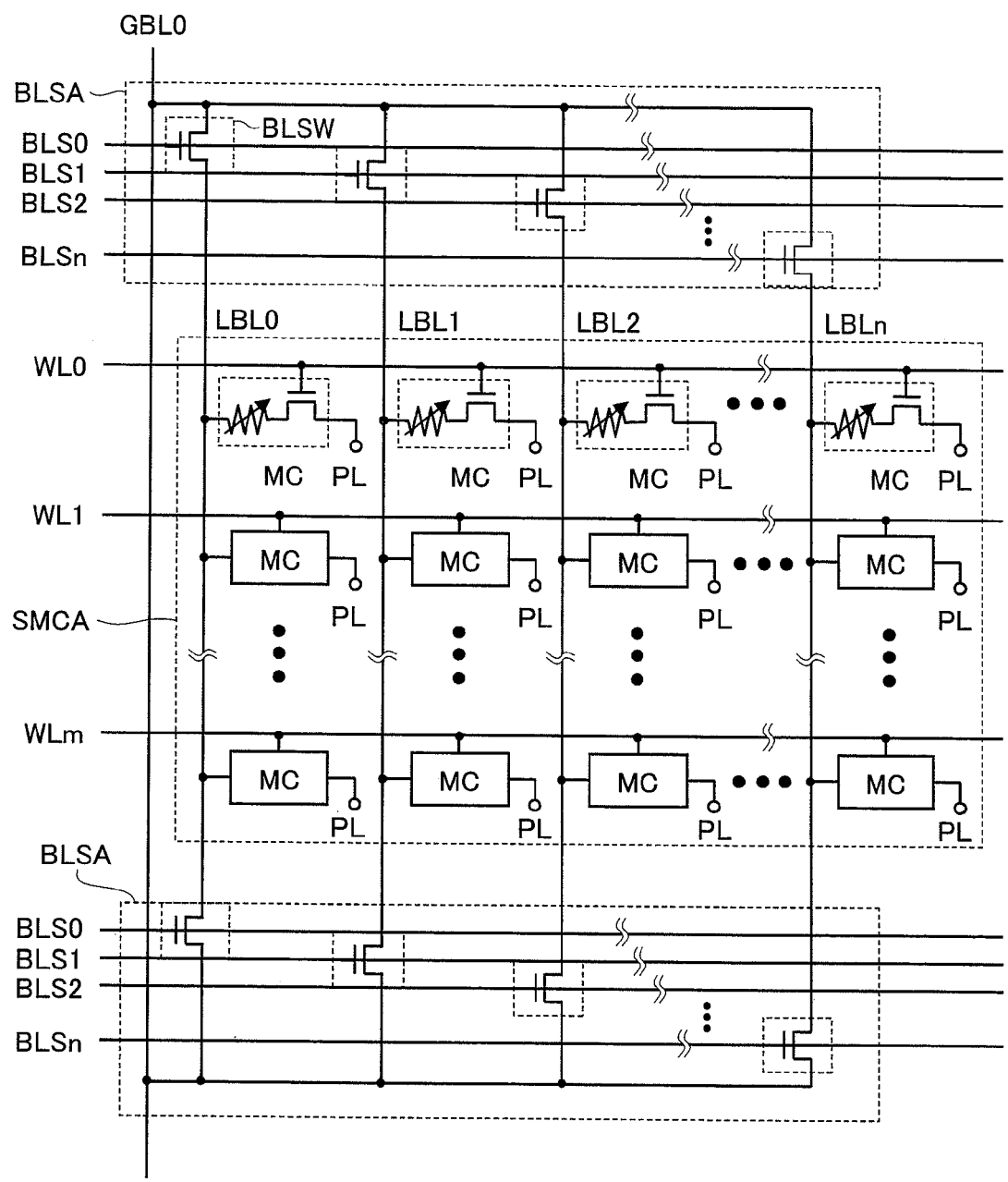
FIG. 12 is a view showing one example of the configuration of a sub-memory block in the semiconductor device according to the first embodiment of the present invention.
Figure 13A:
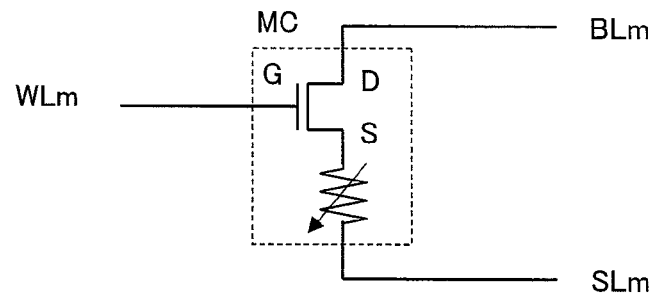
FIG. 13A is a view showing one example of the configuration of the memory cell in the semiconductor device according to the first embodiment of the present invention.
Figure 13B:
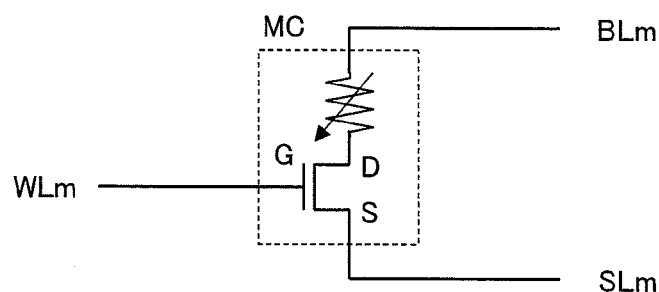
FIG. 13B is a view showing one example of the configuration of the memory cell in the semiconductor device according to the first embodiment of the present invention.
Figure 13C:
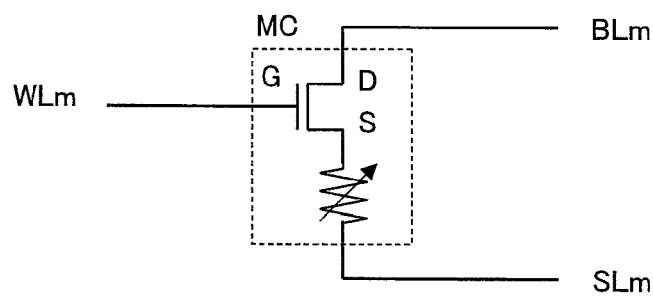
FIG. 13C is a view showing one example of the configuration of the memory cell in the semiconductor device according to the first embodiment of the present invention.
Figure 13D:
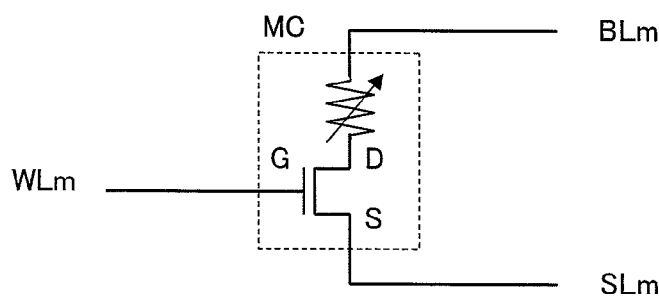
FIG. 13D is a view showing one example of the configuration of the memory cell in the semiconductor device according to the first embodiment of the present invention.

FIG. 12 shows one example of the configuration of the sub-memory block SMB.

Figure 2B:
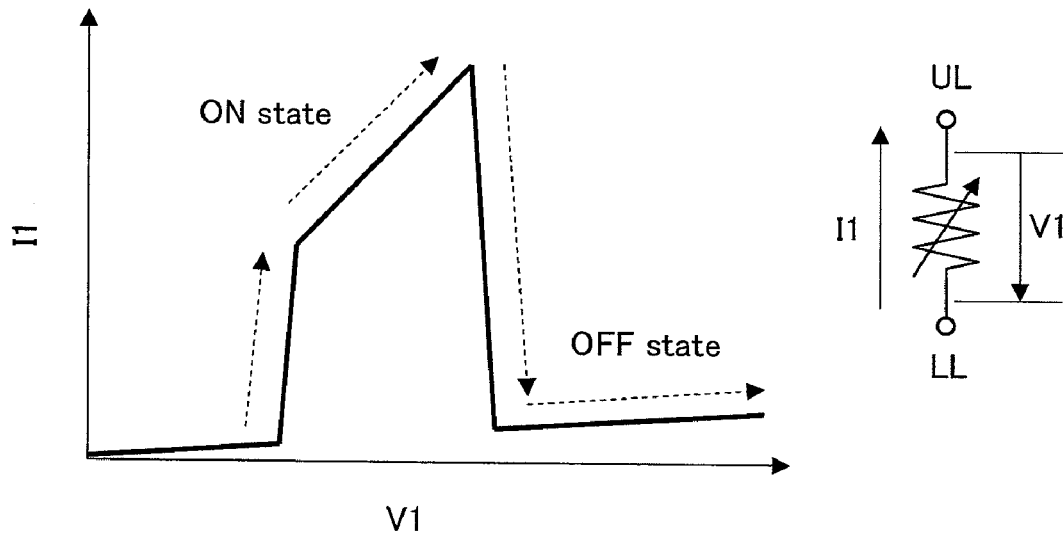
FIG. 2B is a view showing one example of the current-voltage characteristics in a general phase change memory.
Figure 5:
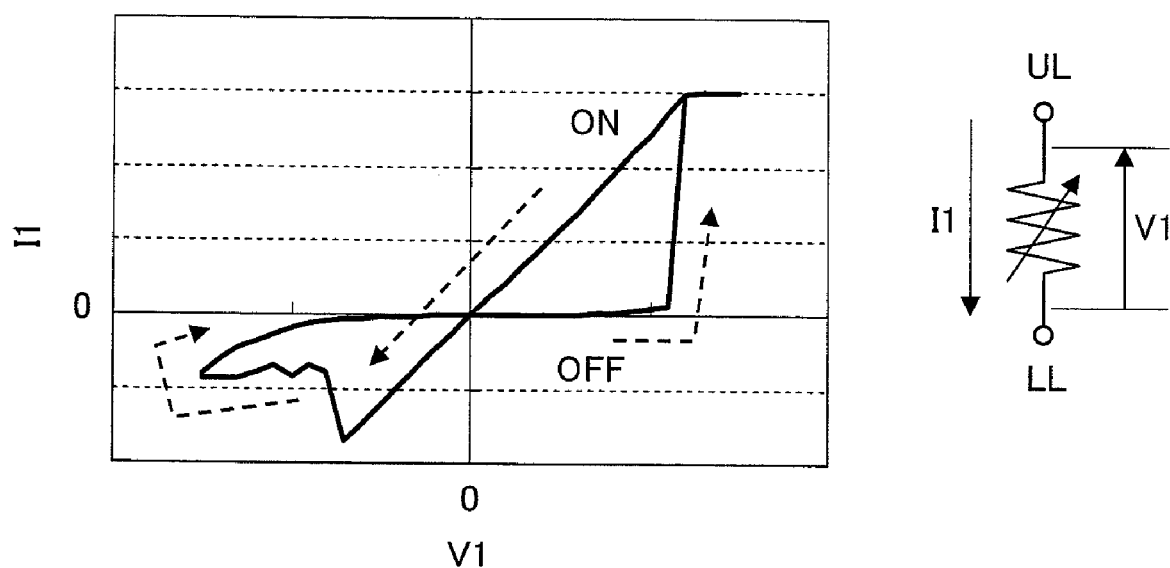
FIG. 5 is a view showing one example of the current-voltage characteristics when the current direction is changed in the MRAM and ReRAM of FIG. 3 and the solid electrolyte memory of FIG. 4.
Figure 6A:
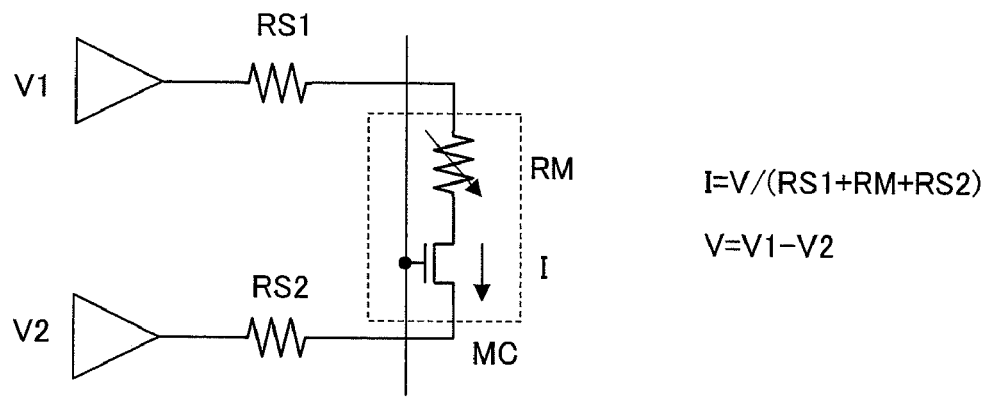
FIG. 6A is a view showing one example of a circuit when a memory cell is rewritten in the description of the first problem to be solved by the present invention.
Figure 6B:
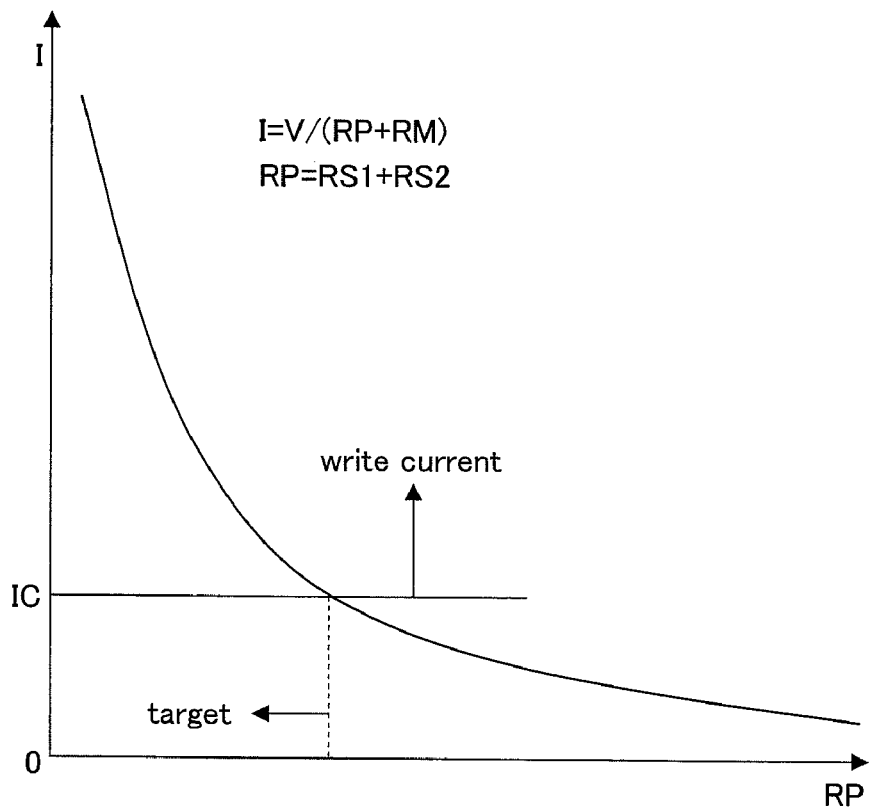
FIG. 6B is a view showing one example of the relation between a parasitic load and a rewriting current in the description of the first problem to be solved by the present invention.
Figure 7A:
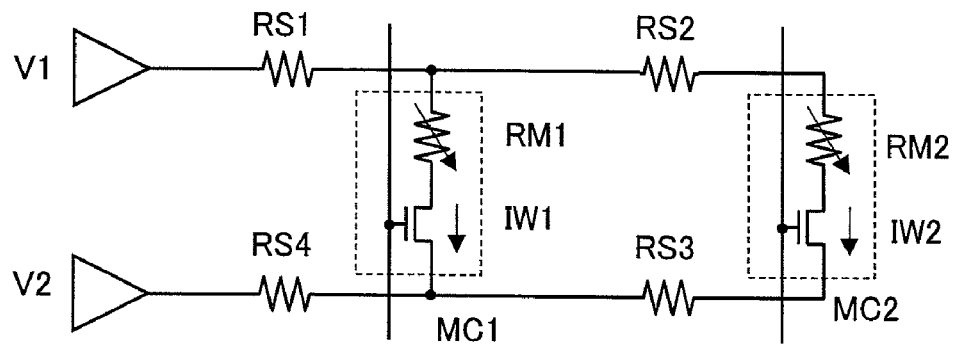
FIG. 7A is a view showing one example of a circuit when a memory cell is rewritten in the description of the second problem to be solved by the present invention.
Figure 7B:
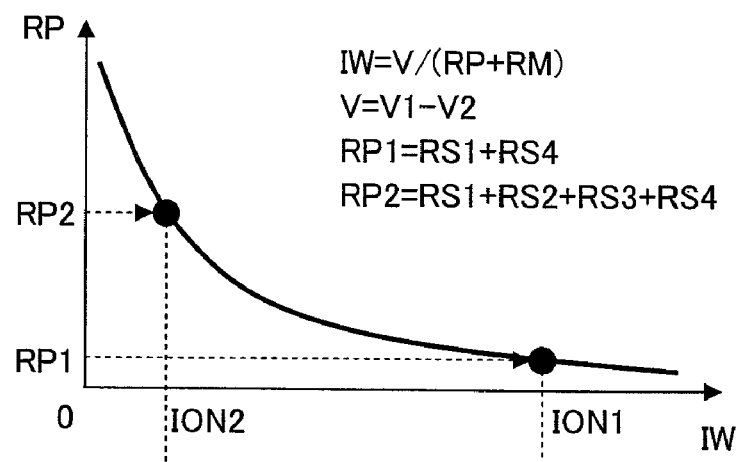
FIG. 7B is a view showing one example of the relation between a rewriting current, a parasitic load and a memory cell resistance in the description of the second problem to be solved by the present invention.
Figure 7B:
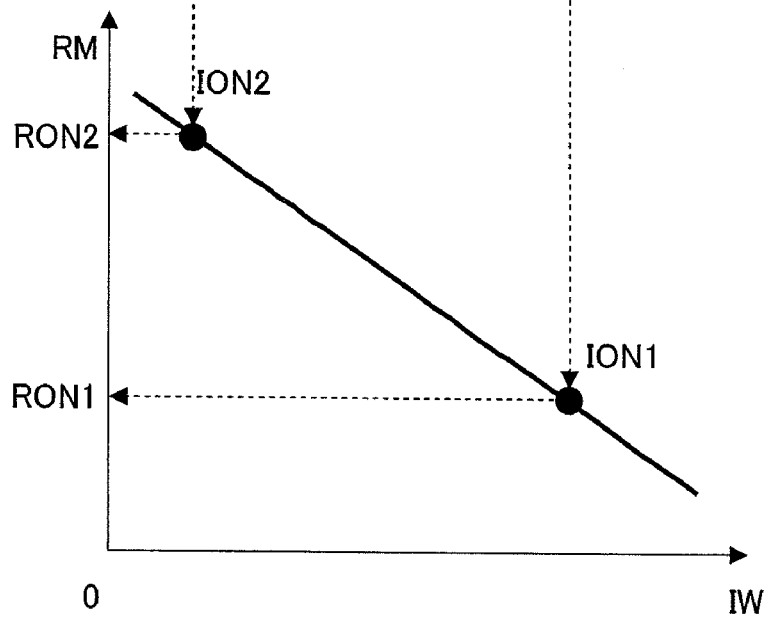

The sub-memory cell array SMCA is constituted of m word lines WL, n local bit lines LBL, a plate PL and memory cells MC disposed at desired intersections of the word lines WL and the local bit lines LBL. The arrow mark inscribed on the resistance change element shows a direction of the current caused to flow in order to change the memory cell into a state of the logical value "1". The memory cell MC is constituted by using the resistance change element and the select element showing the current-voltage characteristics shown in FIG. 2B and FIG. 5. The memory cell using the resistance change element showing the current-voltage characteristics shown in FIG. 2B is characterized in that it is turned ON when the current is caused to flow from the local bit line LBL to the plate PL and the potential difference between the LBL and the PL exceeds a low resistance (ON) threshold voltage, and it is turned OFF when the current is caused to flow from the LBL to the PL and the potential difference between the LBL and the PL exceeds a high resistance (OFF) threshold voltage. The memory cell using the resistance change element showing the current-voltage characteristics shown in FIG. 5 is characterized in that it is turned ON when the current is caused to flow from the LBL to the PL and the potential difference between the LBL and the PL exceeds an ON threshold voltage, and it is turned OFF when the current is caused to flow from the PL to the LBL and the potential difference between the PL and the LBL exceeds an OFF threshold voltage. Further, the above-described memory cell includes those characterized in that the resistance value after the rewriting changes depending on the magnitude of the rewriting current as shown in FIG. 7B.

The bit line select switch arrays BLSA are adjacently disposed on the upside and downside of the sub-memory cell array SMCA in a direction of the local bit line LBL, and connect n local bit lines LBL of the SMCA to the global bit line GBL0. The BLSA is constituted of, for example, n bit line select switches BLSW. The BLSW is constituted of, for example, one MOS transistor. In the MOS transistor, for example, the drain is connected to the global bit line GBL, the source is connected to the LBL, and the gate is controlled by the bit line select line BLS.

Examples of the configuration of the memory cell MC are shown in FIG. 13A to FIG. 13D.

The gate of the transistor is taken as G, the source is taken as S, and the drain is taken as D. In the MC shown in FIG. 13A, the gate is connected to the WL, the drain is connected to the BL, and the source is connected to the resistance change element, respectively, and the resistance change element is disposed so that its resistance is reduced when the current flows from the BL to the SL. In the MC shown in FIG. 13B, the gate is connected to the WL, the source is connected to the SL, and the drain is connected to the resistance change element, respectively, and the resistance change element is disposed so that its resistance is reduced when the current flows from the BL to the SL. In the MC shown in FIG. 13C, the gate is connected to the WL, the source is connected to the resistance change element, and the drain is connected to the BL, respectively, and the resistance change element is disposed so that its resistance is reduced when the current flows from the SL to the BL. In the MC shown in FIG. 13D, the gate is connected to the WL, the source is connected to the SL, and the drain is connected to the resistance change element, respectively, and the resistance change element is disposed so that its resistance is reduced when the current flows from the SL to the BL.

Figure 14:
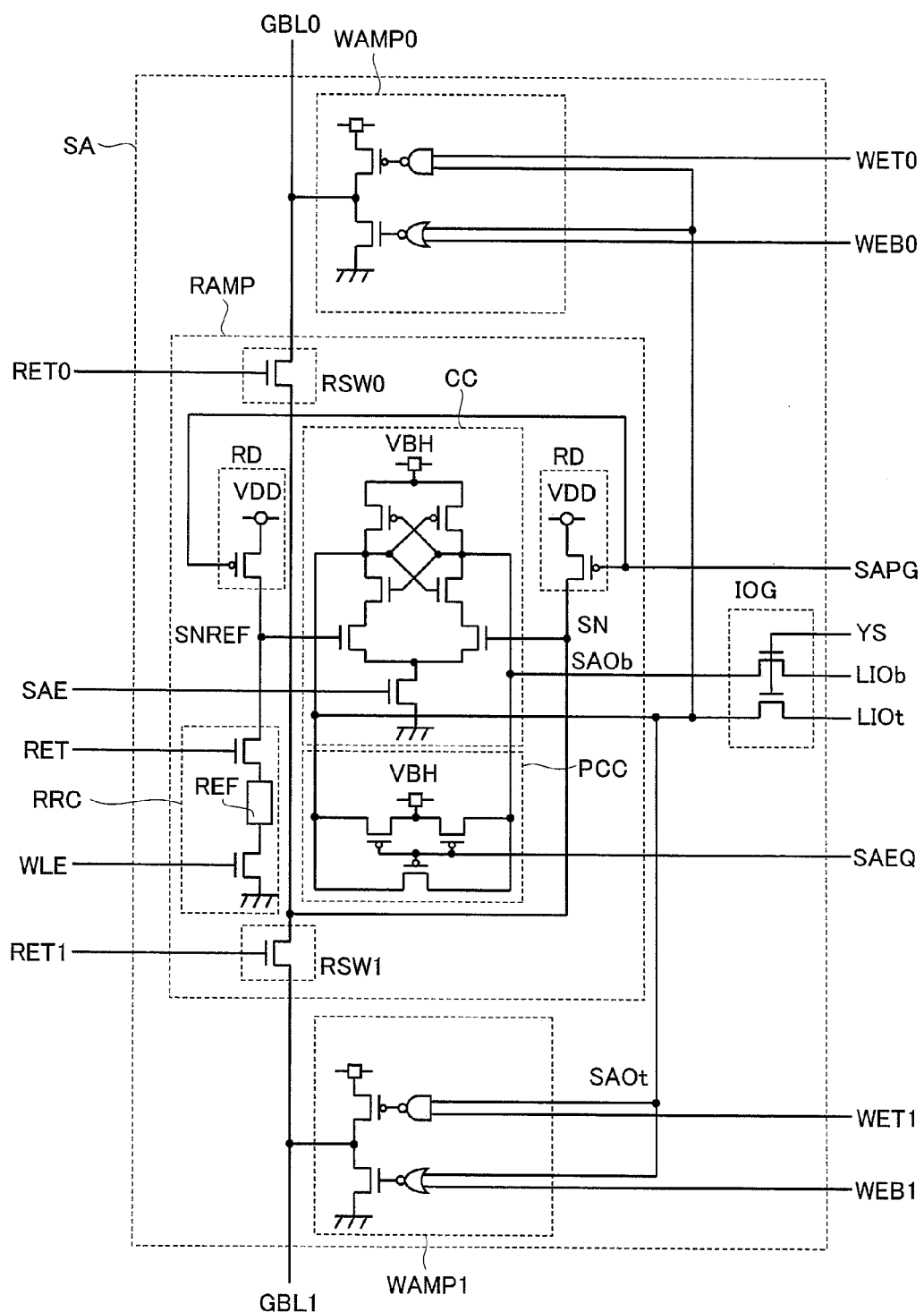
FIG. 14 is a view showing one example of the configuration of a sense amplifier in the semiconductor device according to the first embodiment of the present invention.

FIG. 14 shows one example of the configuration of the sense amplifier SA.

The sense amplifier SA is constituted of a reading portion RAMP, a writing portion WAMP and a local input-output line switch IOG. The RAMP and the IOG are shared by a writing portion WAMP0 to drive the global bit line GBL0 on the upside of the sense amplifier and a writing portion WAMP1 to drive the global bit line GBL1 on the downside of the sense amplifier. This helps to reduce the area of the sense amplifier circuit. The WAMP and the RAMP are connected by an active high sense amplifier out signal line SAOt and the global bit line GBL. The IOG and the RAMP are connected by the SAOt and an inverting sense amplifier out signal line SAOb. The IOG and the WAMP are connected by the SAOt.

The reading portion RAMP is constituted of, for example, a read switch RSW, two read drivers RD, a cross couple CC, a pre-charge circuit PCC and a reading reference circuit RRC. The RRC is constituted of, for example, two MOS transistors and a reference load REF and is controlled by a read enable signal RET and a word line enable signal WLE. The RSW0 is controlled by an upper memory cell read enable signal RET0. The RSW1 is controlled by a lower memory cell read enable signal RET1. The CC is controlled by a sense amplifier enable signal SAE. The RD is controlled by a reading current control signal SAPG. The PCC is controlled by a sense amplifier equalizing signal SAEQ. The PCC is a pre-charge circuit for charging the SAOt and the SAOb to the VBH at the standby time and is controlled by the SAEQ.

In the following, the operation of the RAMP in the reading will be described. First, the sense amplifier equalizing signal SAEQ transitions to high from low, and the pre-charge is terminated. Next, the reading current is caused to flow to the memory cell. The reading current is determined by a PMOS load whose gate potential is controlled by the VDD and the SAPG. When the memory cell on the upside of the SA is read, the RET0 is selected, and when the memory cell on the downside of the SA is read, RET1 is selected. The reading current flows through the load PMOS from the VDD to pass through a sense node SN to the global bit line selected by the RET0 or the RET1. The current for reference flows through the load PMOS from the VDD to pass through a reference sense node SNREF to a ground potential through the reference load REF simulated as the current path to the memory cell. When the resistance value of the memory cell to be read is high, that is, when the logical value is "0", the potential of the SN is higher than the potential of the SNREF. This is because a voltage drop at the memory cell is larger than a voltage drop at the REF. The SAOt is amplified to the voltage VBH and the SAOb is amplified to the ground potential by a cross couple activated by the sense amplifier enable signal SAE, and the potential difference between the SN and the SNREF corresponds to the difference between the voltage VBH and the ground potential. When the resistance value of the memory cell to be read is low, that is, when the logical value is "1", the potential of the SN is lower than the potential of the SNREF. This is because a voltage drop at the memory cell is smaller than a voltage drop at the REF. The SAOt is amplified to the ground potential and the SAOb is amplified to the voltage VBH by the cross couple, and the potential difference between the SN and the SNREF corresponds to the difference between the ground potential and the voltage VBH. The memory information read to the SAOt and the SAOb by a column select line YS is read to a local input-output line LIOt and an inverse local input-output line LIOb.

In the following, the operation of the writing portion WAMP will be described. When the memory cell is put into a high resistive state, that is, when the logical value "0" is to be written, if the column select line YS is selected, the SAOt is charged toward the ground potential by the LIOt, and the SAOb is charged toward the VBH by the LIOb. Since the RET is low, the SN and the SNREF are charged to the potential close to the VDD, and when the SAE is turned ON, the SAOt is charged to the ground potential and the SAOb is charged to the VBH by the cross couple. When an active high write enable signal WET and an active low write enable signal WEB are activated, since the SAOt is low, the GBL is charged to the ground potential by the WAMP. When the potential of the plate PL is set to, for example, VBH/2, the current flows from the PL to the GBL. As a result, the logical value "0" is written to the memory cell. When the memory cell is put into a low resistive state, that is, when the logical value "1" is to be written, if the column select line YS is selected, the SAOt is charged toward the VBH by the LIOt, and the SAOb is charged toward the ground potential by the LIOb. Since the RET is low, the SN and the SNREF are charged to the potential close to the VDD, and when the SAE is turned ON, the SAOt is charged to the VBH and the SAOb is charged to the ground potential by the cross couple. When the active high write enable signal WET and the active low write enable signal WEB are activated, since the SAOt is high, the GBL is charged to the VBH by the WAMP. When the potential of the plate PL is set to, for example, VBH/2, the current flows from the GBL to the PL. By this means, the logical value "1" is written to the memory cell.

Figure 15:
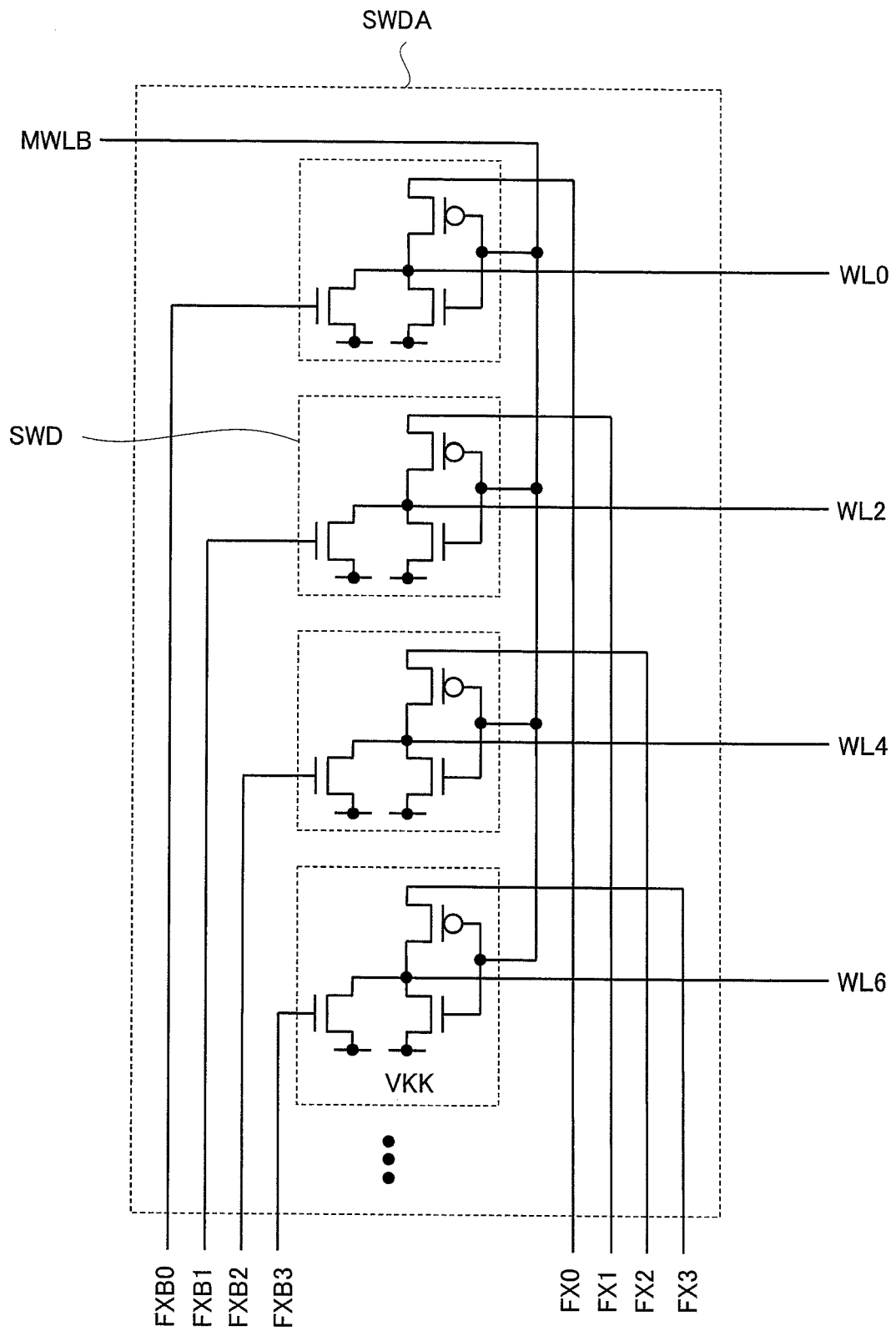
FIG. 15 is a view showing one example of the configuration of a sub-word driver column in the semiconductor device according to the first embodiment of the present invention.

FIG. 15 shows one example of the configuration of the sub-word driver column SWDA.

Since the sub-word driver column SWDA is disposed in the periphery of the memory cell array MCA as shown in FIG. 9B and the word line WL of the memory cell array MCA is driven by either of the left or right sub-word driver column SDA, the number of the sub-word drivers SWD included in one of the sub-word driver columns SWDA may be half the number of the word lines WL included in the memory cell array MCA. The sub-word driver SWD is constituted of one PMOS transistor and two NMOS transistors. In the PMOS transistor, the gate is connected to an inverse main word line MWLB, the source is connected to a sub-word driver select line FX, and the drain is connected to the word line WL. In one of the NMOS transistors, the gate is connected to the MWLB, the source is connected to a negative voltage VKK equal to or lower than the VSS, and the drain is connected to the word line WL. In the other NMOS transistor, the gate is connected to an inverse sub-word driver select line FXB, the source is connected to the VKK, and the drain is connected to the word line WL.

Figure 16:
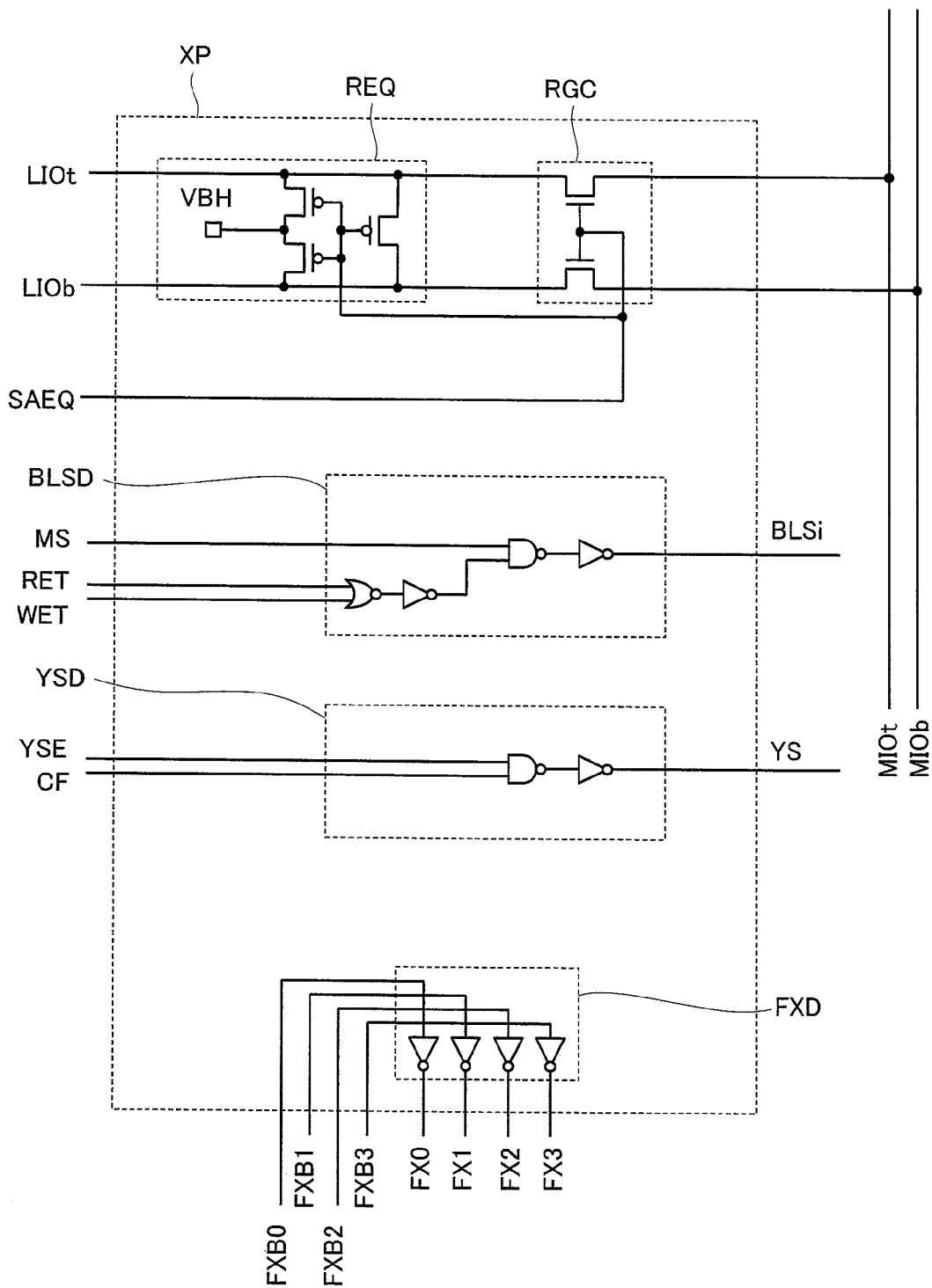
FIG. 16 is a view showing one example of the configuration of a row control circuit in the semiconductor device according to the first embodiment of the present invention.

FIG. 16 shows one example of the configuration of the row control circuit XP.

The row control circuit XP is constituted of a local input-output line equalizer circuit REQ which pre-charges the local input-output line LIOt and the inverse local input-output line LIOb, a main input-output gate RGC which connects a local input-output line LIO and a main input-output line MIO, a bit line select signal driver BLSD, a column select line driver YSD, and a sub-word driver select line driver FXD. The REQ is constituted of, for example, three PMOS transistors, and charges the LIOt and the LIOb to the VBH when the sense amplifier equalizing signal SAEQ is turned OFF. The RGC is constituted of, for example, two NMOS transistors, and connects the LIOt to the MIOt and the LIOb to the MIOb when the SAEQ is turned ON. In the BLSD, the bit line select signal BLS is generated by the read enable signal RET, the write enable signal WET and the mat select signal MS. For example, a circuit configuration in which the BLS is generated by taking an OR logic of the RET and the WET and an AND logic of the MS is conceivable. In the YSD, the YS is selected from a column selection enable signal YSE and a column pre-decode signal CF. For example, a circuit configuration in which the YS is outputted by taking the AND logic of the YSE and the CF is conceivable. In the FXD, the sub-word driver select signal FX is generated from the inverse sub-word driver select signal FXB. For example, it is constituted of the same number of the NOT logics as the FXB.

Figure 17:
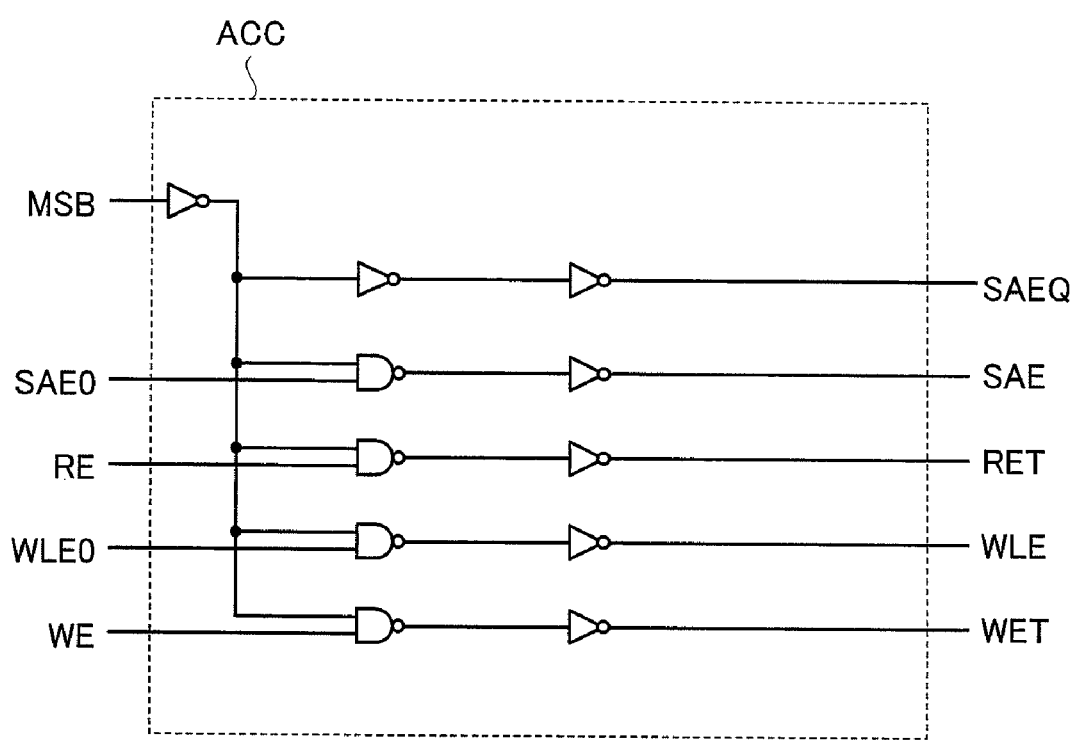
FIG. 17 is a view showing one example of the configuration of an array control circuit in the semiconductor device according to the first embodiment of the present invention.

FIG. 17 shows one example of the configuration of the array control circuit ACC.

In the array control circuit ACC, a signal group for controlling the sense amplifier is generated from the timing signal generated in the CNTL shown in FIG. 9A. The sense amplifier equalizing signal SAEQ is generated from a mat selection inversion signal MSB, the sense amplifier enable signal SAE is generated from the MSB and the sense amplifier enable original signal SAE0, the read enable signal RET for sense amplifier control is generated from the read enable signal RE, the word line enable signal WLE is generated from a word line enable original signal WLE0, and the write enable signal WET for sense amplifier control is generated from the write enable signal WE. For example, the SAEQ outputs an inverted signal of the MSB. The SAE is created by taking the AND logic of the inversion signal of the MSB and the SAE0. The RET is created by taking the AND logic of the inversion signal of the MSB and the RE. The WLE is created by taking the AND logic of the inversion signal of the MSB and the WLE0. The WET is created by taking the AND logic of the inversion signal of the MSB and the WE.

Figure 18:
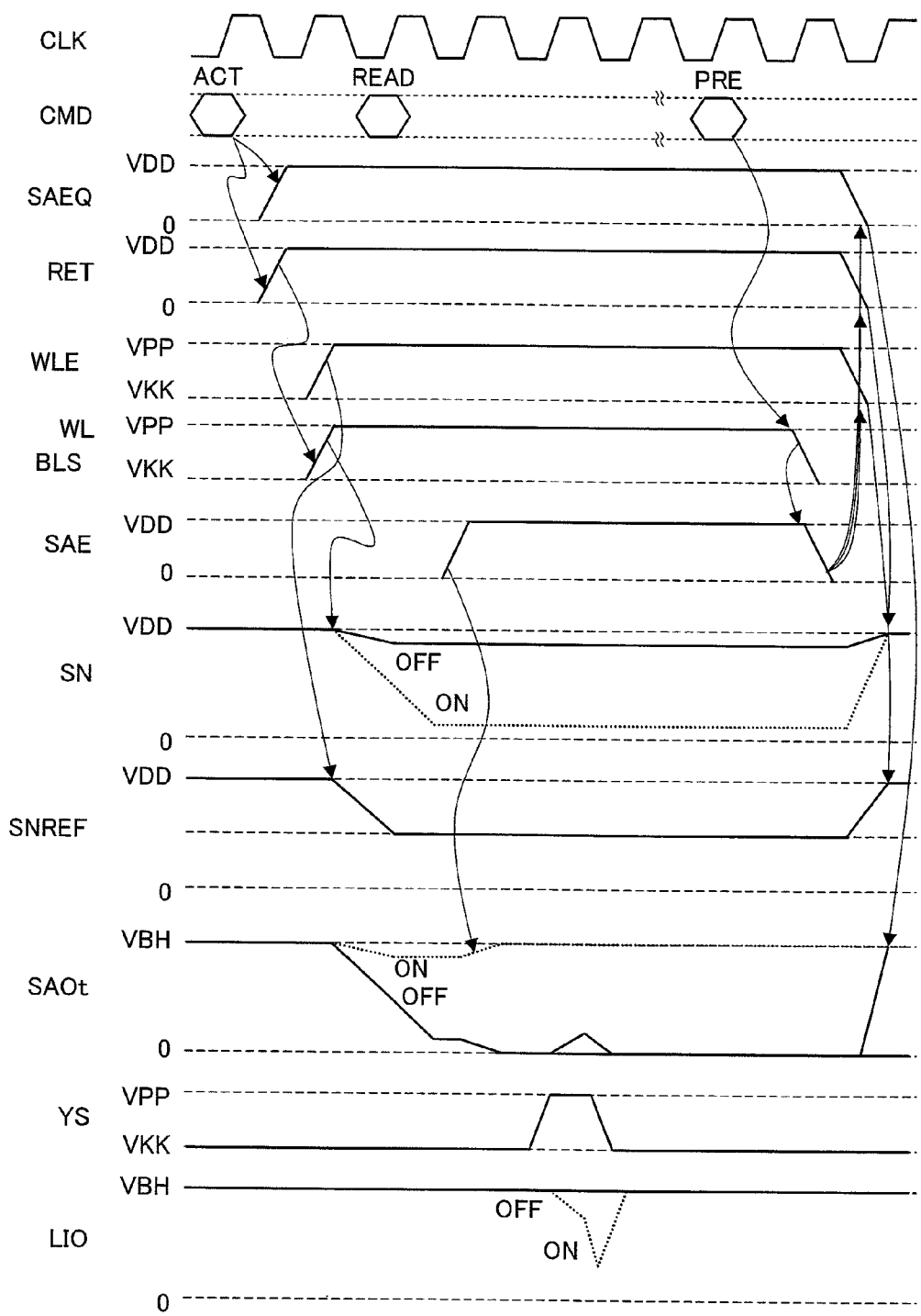
FIG. 18 is a view showing one example of an operating waveform when information stored in the memory cell is read in the semiconductor device according to the first embodiment of the present invention.

FIG. 18 shows one example of an operating waveform when information stored in the memory cell is read in the circuits shown in FIG. 12 and FIG. 14.

First, a standby state will be described. In the standby state, the sense node SN and the reference sense node SNREF are charged to the VDD. The sense amplifier out signal SAO and the local input-output signal LIO are charged to the VBH. When an ACT command is inputted in synchronization with a clock, the SAEQ and the RET created by the ACC shown in FIG. 17 are charged from 0 to the VDD. At the timing where the RET and the word line enable signal WLE are synchronized, the word line WL and the bit line select line BLS are charged from the potential VKK lower than the ground potential to the boosted potential VPP. As a result, the memory cell designated by an input address is selected, and the reading current flows. When the WLE is charged from the VKK to the VPP, the reference node SNREF is lowered from the VDD toward the reference potential set by the reference load. When the reference potential is set to be, for example, VDD/2, the large reading margin can be set. When the reading current flows, the sense node SN changes in accordance with the resistive state of the memory cell. When the memory cell is in a low resistive state, that is, in an ON state, it has a potential close to the ground potential, and when the memory cell is in a high resistive state, that is, in an OFF state, it has a potential not lowered so much from the VDD. At this time, the potentials of the sense amplifier out signals SAOt and SAOb are not lowered so much from the VBH in accordance with the potentials of the SN and the SNREF when the memory cell is in an ON state, and are lowered toward the ground potential when the memory cell is in an OFF state. The sense amplifier enable signal SAE is turned ON at the timing when the state of the SN is put into a steady state. Then, if the state of the sense amplifier out signal SAOt is ON according to the state of the memory cell, it is charged to the VBH, and if the state is OFF, it is charged to the ground potential. When a READ command is inputted in the state where the state of the memory cell is latched in the reading portion of the sense amplifier, the column select signal YS is charged from the VKK to the VPP, and memory information is outputted to the local input-output line LIO. Thereafter, when a PRE command is inputted, the WL and the BLS change from the VPP to the VKK, the SAE is lowered to the ground potential from the VDD, the SAEQ and the RET are lowered to the ground potential from the VDD, and the WLE is lowered to the VKK from the VPP. As a result, the SN and the SNREF become the VDD, and the SAOt and the SAOb are pre-charged to the VBH, so that the operation returns to the standby state and the reading operation is terminated.

Figure 19:
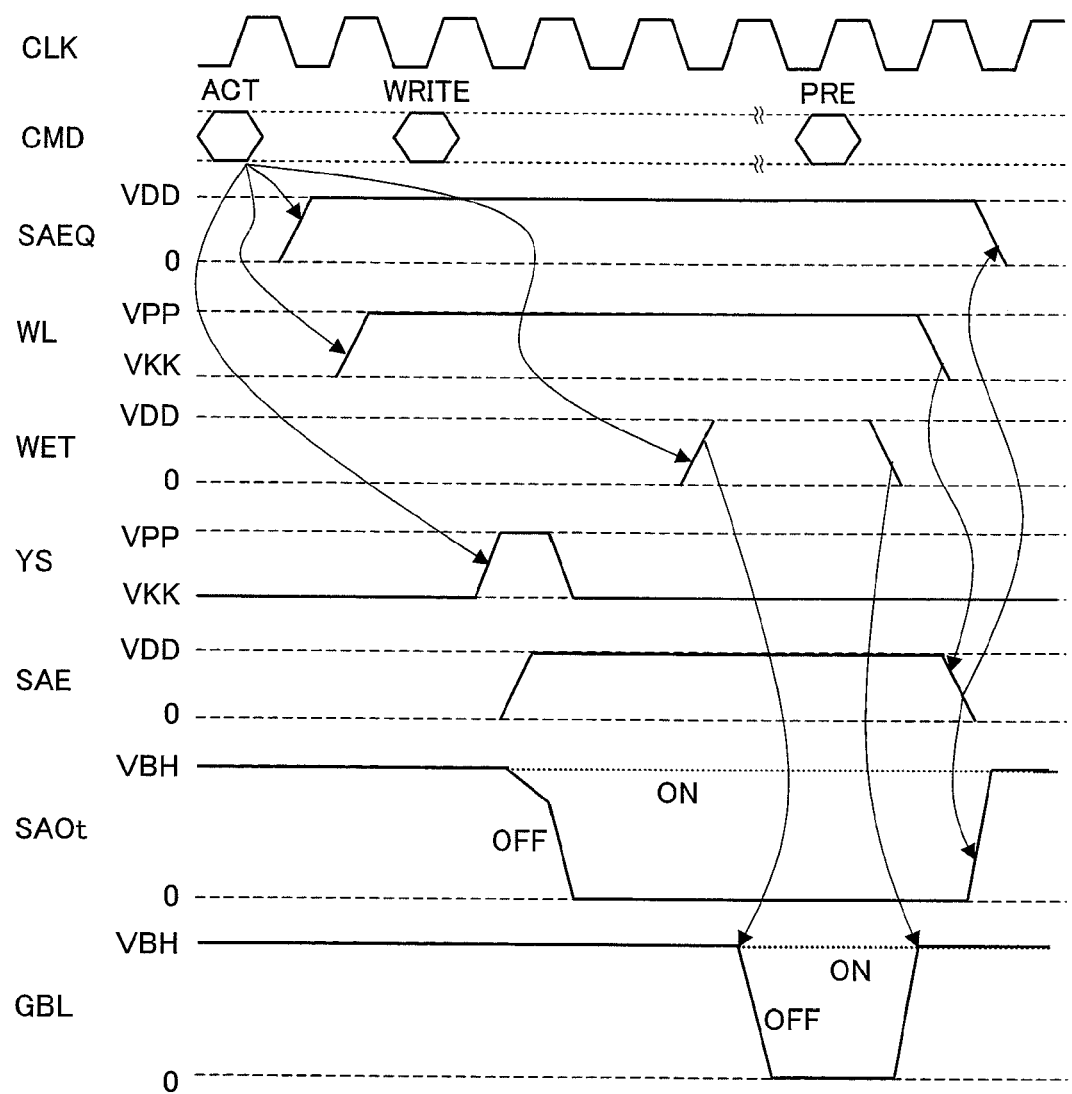
FIG. 19 is a view showing one example of an operating waveform when information is written in the memory cell in the semiconductor device according to the first embodiment of the present invention.

FIG. 19 shows one example of the operating waveform when information is written in the memory cell in the circuits shown in FIG. 12 and FIG. 14.

The standby state is the same as the state described in FIG. 18. When the ACT command is inputted in synchronization with the clock CLK, the sense amplifier equalizing signal SAEQ changes to the VDD from the ground potential in synchronization with the timing generated by the CNTL described in FIG. 9A, so that the equalization of the sense amplifier is terminated. When the word line WL is raised to the boosted potential VPP from the potential VKK lower than the ground potential, the preparation to write the information in the memory cell is completed. When the column select line YS is selected, the sense amplifier for performing the writing is determined, and the sense amplifier out signal SAO starts to be charged to the desired level by the LIO charged in accordance with the information to be written. When the sense amplifier enable signal changes to the VDD from the ground potential, the latch portion of the sense amplifier is turned ON and the writing information is latched, so that the SAO is determined to the VBH when writing ON and the SAO is determined to the ground potential when writing OFF. When the write enable signal WET changes to the VDD from the ground potential, the writing portion of the sense amplifier is turned ON, so that the VBH is outputted when ON is written in the global bit line GBL, and the ground potential is outputted when OFF is written. In this manner, desired digital information is written in the memory cell. When the PRE command is inputted in synchronization with the clock, the word line WL changes to the VKK from the VPP, and as a result, the SAE changes to the ground potential from the VDD. Thereafter, the SAEQ changes to the ground potential from the VDD, and at the same time, the SAO is pre-charged to the VBH. In this manner, the operation returns to the standby state, and the writing operation is terminated.

Figure 20:
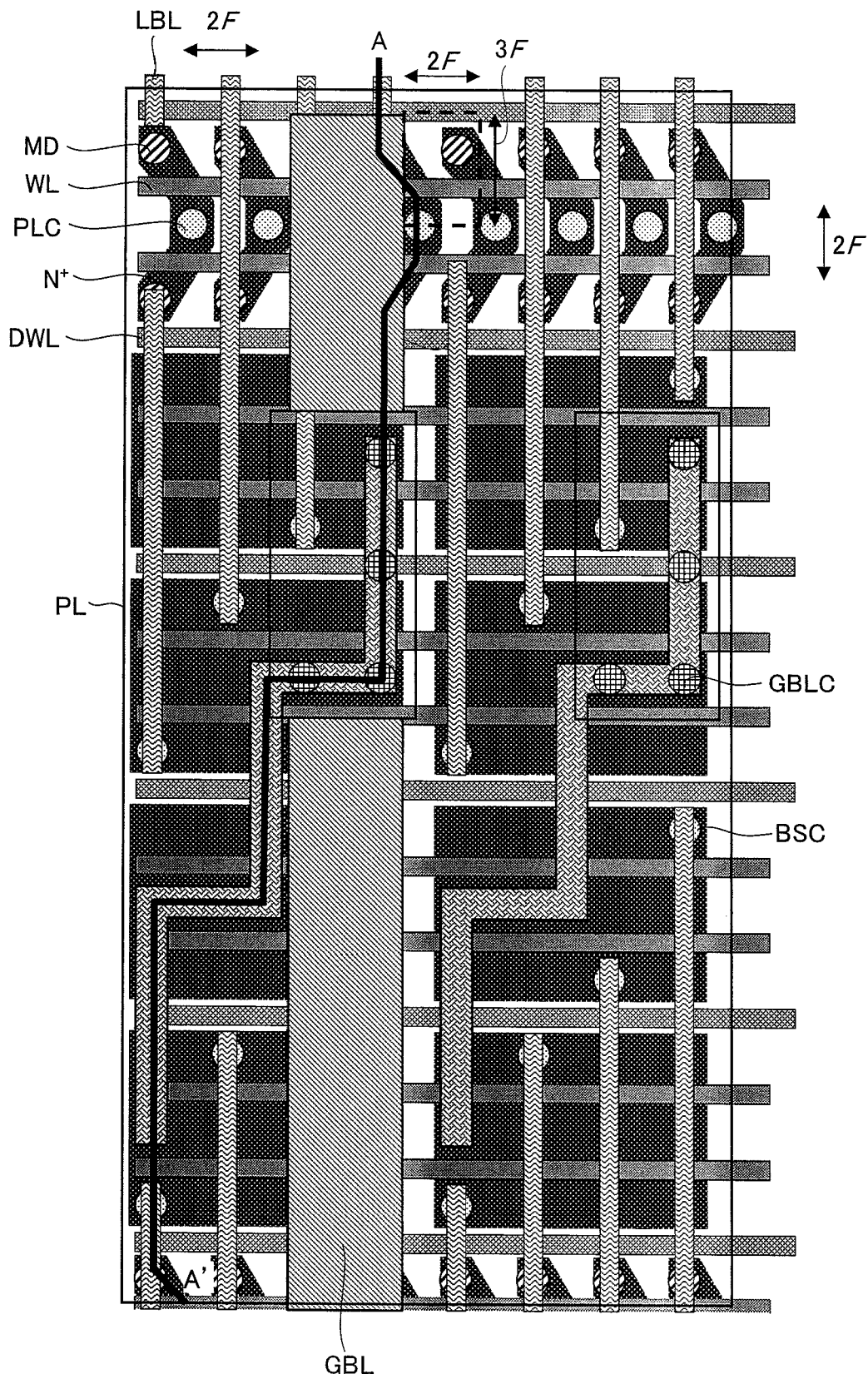
FIG. 20 is a view showing one example of a layout of a sub-memory cell array and bit line select switch arrays adjacently disposed on its downside and upside in the semiconductor device according to the first embodiment of the present invention.

FIG. 20 shows one example of the layout of the bit line select switch array BLSA adjacent on the downside of the sub-memory cell array SMCA and the BLSA adjacent on the upside of the SMCA. FIG. 20 corresponds to a circuit diagram in which the lower end of the SMCA and the BLSA on the downside and the upper end of the SMCA and the BLSA on the upside are arranged in the row direction in the sub-memory block SMB shown in FIG. 12.

In the memory cell, a dummy word line DWL is provided for every two word lines WL. By this means, it is possible to simplify the mask of a diffusion layer N+. A plate contact PLC is shared by the adjacent memory cells which do not share the word line WL and the dummy word line DWL. The local bit line LBL and the plate PL are different in the height of a wiring layer. The portion surrounded by a dotted square represents the memory cell MC of one bit, and its area is $6F^2$ if the process node is taken as F. The cell area is $6F^2$ also in the latest DRAM and is on the same level. However, the resistance change element is more easily manufactured as compared with the capacitor of the DRAM, and it is possible to manufacture a 1T1R memory even in a miniaturized process in which a 1T1C DRAM is difficult to manufacture.

Since the bit line select switch is constituted of four local bit lines LBL for one global bit line GBL in this case, it is constituted of, for example, four MOS transistors. The gate of the transistor corresponds to the bit line select line BLS, and this is disposed at the same pitch as the word line WL of the memory cell MC. The bit line select switch shares a contact for connecting to the global bit line by two MOS transistors. Therefore, the area of the diffusion layer N+ is $35F^2$ with the two MOS transistors. This has an effect that the large gate width can be taken and the ON resistance of the bit line select switch can be reduced. The adjacent diffusion layers are separated by the dummy word line DWL. As a result, it is possible to fabricate the gate and the dummy word line of the bit line select switch portion in quite the same manner as the repetitive patterns of the WL and the DWL of the memory cell array. By this means, the fabrication of the bit line select switch is facilitated. A total of eight local bit lines from the upside SMCA and from the downside SMCA are bundled together in the same node by the bit line select switch and are connected from this node to the global bit line GBL through a global bit line contact GBLC for connecting to the global bit line.

Figure 21A:
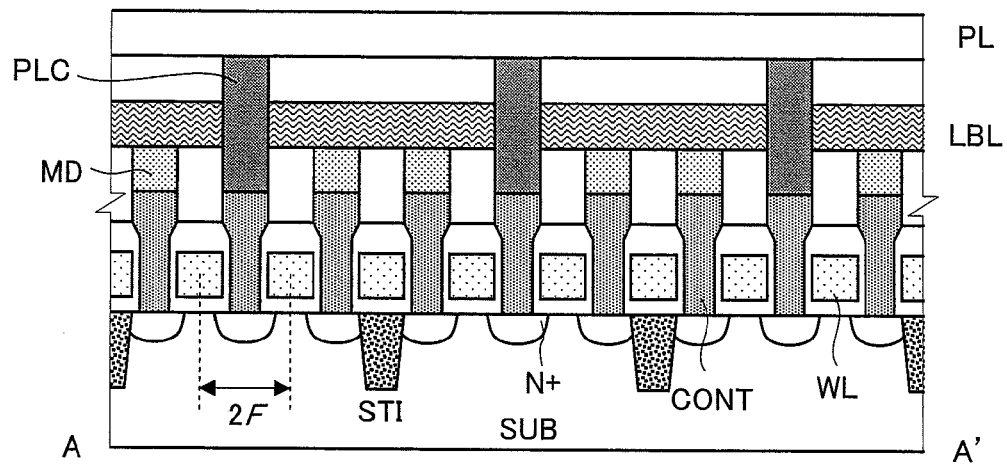
FIG. 21A is a view showing one example of a cross section of the sub-memory cell array in the semiconductor device according to the first embodiment of the present invention.
Figure 21B:
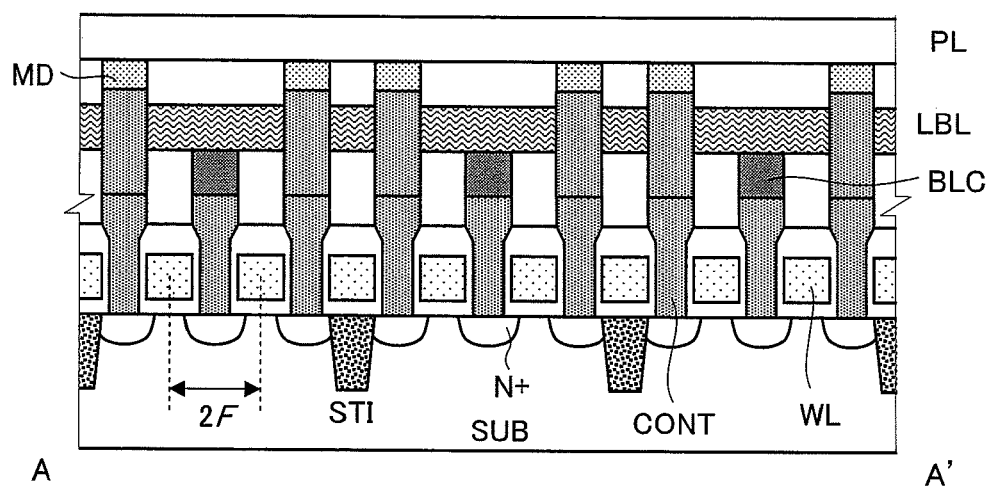
FIG. 21B is a view showing one example of a cross section of the sub-memory cell array in the semiconductor device according to the first embodiment of the present invention.
Figure 21C:
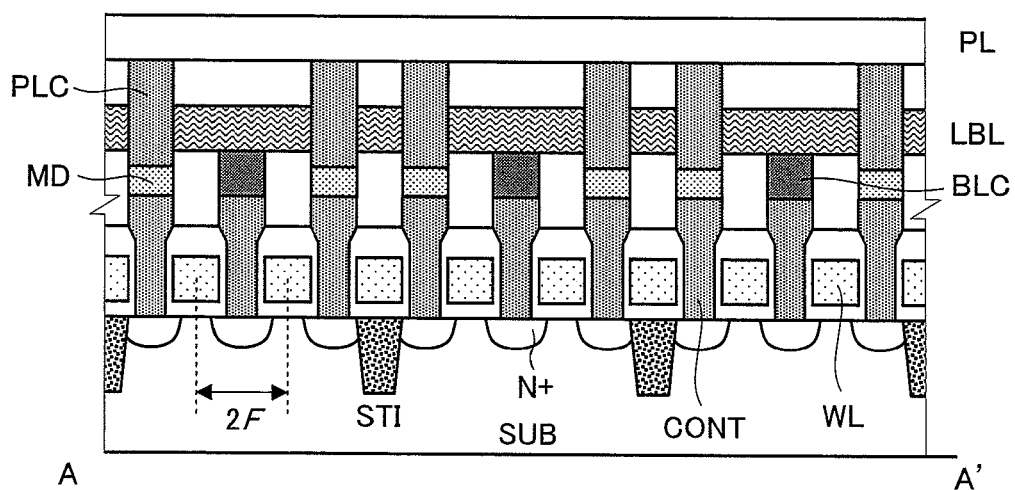
FIG. 21C is a view showing one example of a cross section of the sub-memory cell array in the semiconductor device according to the first embodiment of the present invention.

FIG. 21 shows examples of the cross section of the sub-memory cell array SMCA. FIG. 21A to FIG. 21C are cross sectional views of a portion of the SMCA taken along the line from A to A' in FIG. 20.

In all of FIG. 21A to FIG. 21C, the plate PL is located on the local bit line LBL. By this means, the area of the PL can be increased and the number of times of opening holes in the PL can be reduced. In FIG. 21A, a memory device MD is located between the local bit line and a diffusion layer contact CONT. In FIG. 21B, the MD is located between the plate PL and the CONT and is fabricated on the upper side of the layer in which the local bit line exists. In FIG. 21C, the MD is located between the plate PL and the CONT and is fabricated on the lower side of the layer in which the local bit line exists. The structure shown in FIG. 21B is considered to have an improved yield because the number of manufacturing processes to the layers higher than the memory device MD is small.

Figure 22:
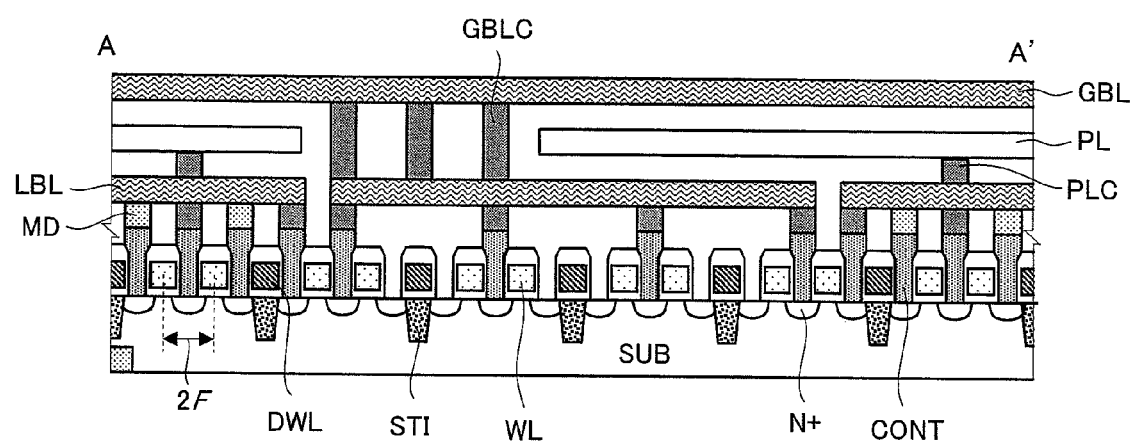
FIG. 22 is a view showing one example of a cross section of the bit line select switch array in the semiconductor device according to the first embodiment of the present invention.

FIG. 22 shows one example of the cross section of the bit line select switch array BLSA. FIG. 22 is a cross sectional view taken along the line from A to A' in FIG. 20.

Since the gate of the MOS transistor of the bit line select switch is fabricated by the same pattern as the word line WL in the memory cell array, it is inscribed as WL. The local bit lines LBL are bundled together in a first layer of the wiring layers and are connected from the bundled node to the global bit line GBL of a third layer of the wiring layers by the global bit line contact GBLC. In the portion through which the GBLC passes, a hole is opened in the plate PL. The capacity of the plate PL is increased by forming the hole to be as small as possible, so that the driving force can be increased.

As described above, the semiconductor device according to the first embodiment includes: the upside and downside bit line select switch arrays BLSA having a plurality of bit line select switches BLSW; and the sub-memory cell array SMCA adjacently disposed between the upside and downside bit line select switch arrays BLSA and having a plurality of local bit lines LBL, a plurality of word lines WL, and a plurality of memory cells MC disposed at intersections of the plurality of word lines WL and the plurality of local bit lines LBL, wherein the local bit lines LBL are connected to the global bit line GBL in the upside and downside bit line select switch arrays BLSA, and thus, two current paths can be provided in parallel by simultaneously turning ON the bit line select switches BLSW in the writing and the reading, so that the parasitic resistance component due to wiring is reduced, the rewriting current sufficient to rewrite the memory cell can be obtained, and at the same time, the location dependency of the parasitic resistance inside the memory cell array can be reduced. More specifically, since the control method of the bit line select switch BLSW can be changed in the writing and the reading, the rewriting current can be increased without increasing the power supply voltage, and at the same time, the location dependency inside the memory cell array of the resistive state after the rewriting can be reduced.

Second Embodiment

A semiconductor device according to a second embodiment of the present invention will be described with reference to FIG. 23 to FIG. 29.

Figure 23:
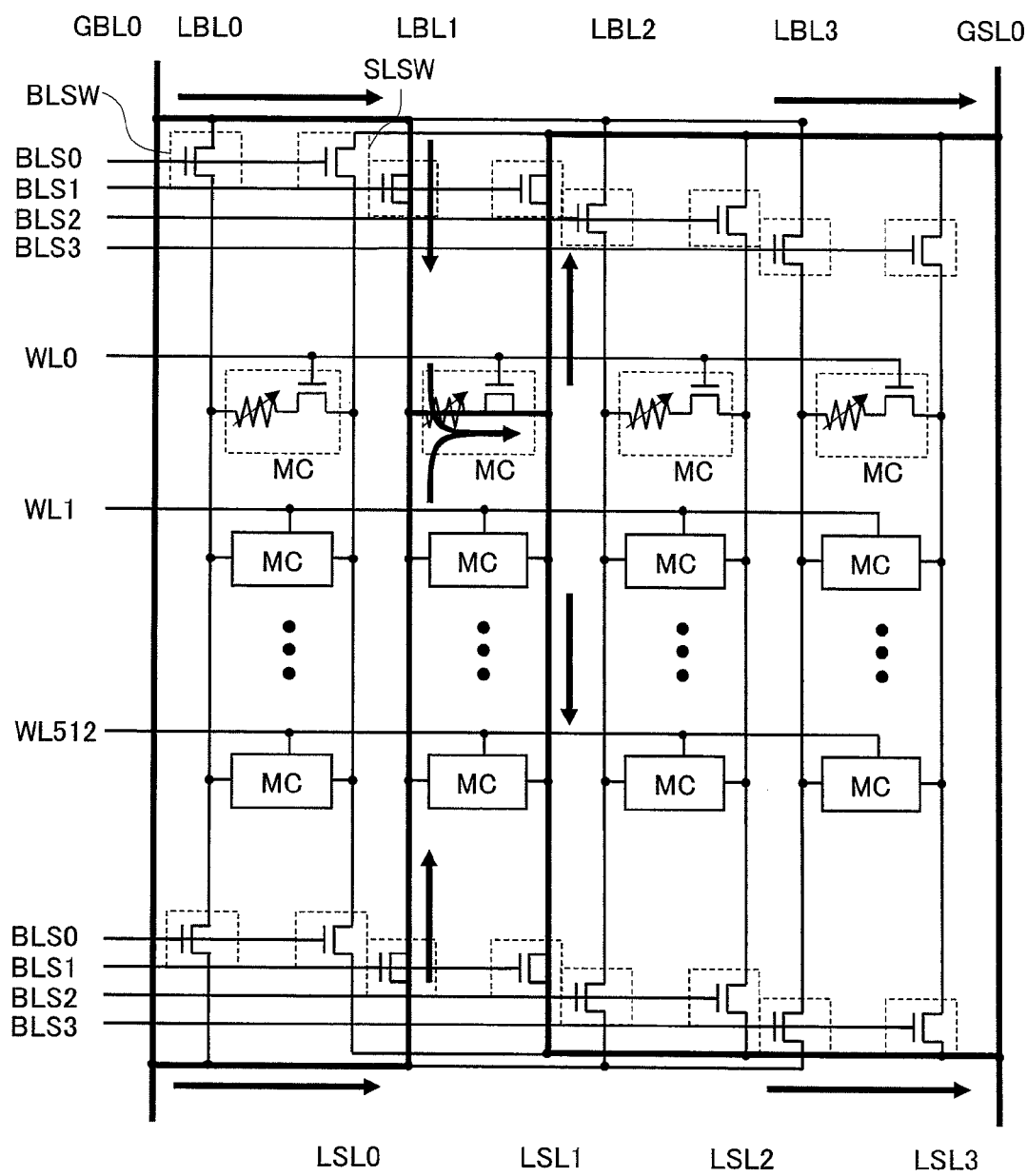
FIG. 23 is a view showing one example of the operation of a memory cell array in a semiconductor device according to a first embodiment of the present invention.

FIG. 23 shows one example of the operation of a memory cell array in the semiconductor device according to the second embodiment.

The thick line of FIG. 23 shows a path of the current flowing into the array when information of the memory cell MC disposed at the intersection of the word line WL0 and the local bit line LBL1 is rewritten (written) from, for example, a logical value "0" to "1". When the connecting direction of a resistance change element is reversed, the rewriting from the logical value "1" to "0" can be performed with the same direction as the rewriting current shown in FIG. 23. A select element of the MC is constituted of, for example, one MOS transistor, and the source side is connected to a local source line LSL1 and the drain is connected to the resistance change element. As compared with the first embodiment, the present embodiment is characterized in that the local source line LSL1 is provided and the local source line is connected to the global source line by two switches SLSW. A global bit line GBL0 is charged to a rewriting potential higher than a global source line GSL by a driver circuit. The GSL is charged to, for example, a ground potential. By taking an AND logic of a mat select signal and a rewriting enable signal, a bit line select line BLS1 is selected. As a result, the bit line select switches BLSW connected to both ends of the local bit line LBL1 and the source line select switches SLSW connected to both ends of the local source line LSL1 are turned ON. The rewriting current flows to the local bit line LBL1 from the global bit line GBL0 in parallel through the bit line select switches BLSW connected to both ends of the local bit line LBL1, flows to the local source line LSL1 through the memory cell MC, and flows to the global source line GSL0 from the source line select switches SLSW connected to both ends of the LSL1. Two current paths from the GBL0 to the LBL1 are provided in parallel, and two current paths from the LSL1 to the GSL0 are also provided in parallel, and therefore, the parasitic resistance component in the current path can be suppressed, so that the high current necessary for the rewriting can be caused to flow to the MC. Further, in the writing, the switches may be controlled in the following manner. That is, depending on the selected word line, the bit line select switch located at the upper end of the LBL1 and the source line select switch located at the lower end of the LSL1 only are turned ON, or the bit line select switch located at the lower end of the LBL1 and the source line select switch located at the upper end of the LSL1 only are turned ON and the remaining switches are turned OFF. In this case, it is necessary to separate the control lines of the bit line select switch and the source line select switch. In other words, instead of controlling the BLSW and the SLSW simultaneously by the BLS, an independent control line is prepared for each of them to control them independently. Although the number of control lines increases, this has an advantage of being able to reduce the location dependency inside the array of the parasitic resistance component of the memory cell MC in the reading. More specifically, this is because, when the bit line select switch and the source line select switch are turned ON as described above, the lengths of the LBL and the LSL in the reading current path can be made equal without depending on the row address of the memory cell.

In the reading, the GBL0 is charged to reading potential by the driver circuit, and the current is caused to flow through the same current path as the rewriting. In that case, the bit line select line BLS1 is selected from a mat select signal and a read enable signal. The reading current reaches the MC through two paths in parallel from the global bit line GBL0 to the local bit line LBL1, and flows to the global source line GSL0 through two paths in parallel from the local source line LSL1. Further, in the reading, the switches may be controlled in the following manner. That is, depending on the selected word line, the bit line select switch located at the upper end of the LBL1 and the source line select switch located at the lower end of the LSL1 only are turned ON, or the bit line select switch located at the lower end of the LBL1 and the source line select switch located at the upper end of the LSL1 only are turned ON and the remaining switches are turned OFF. In this case, it is necessary to separate the control lines of the bit line select switch and the source line select switch. In other words, instead of controlling the BLSW and the SLSW simultaneously by the BLS, an independent control line is prepared for each of them to control them independently. Although the number of control lines increases, this has an advantage of being able to reduce the location dependency inside the array of the parasitic resistance component of the memory cell MC in the reading. More specifically, this is because, when the bit line select switch and the source line select switch are turned ON as described above, the lengths of the LBL and the LSL in the reading current path can be made equal without depending on the row address of the memory cell.

Figure 24:
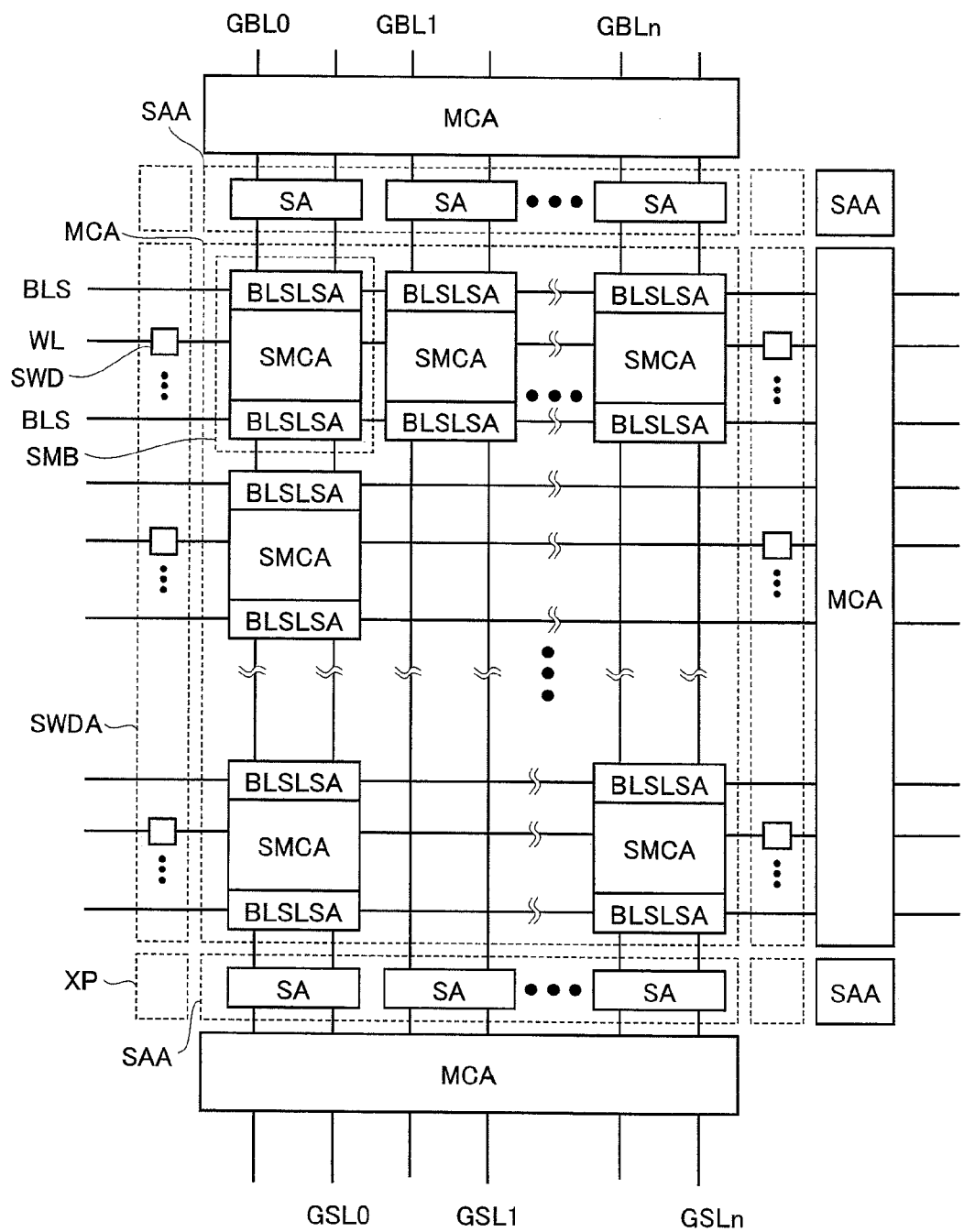
FIG. 24 is a view showing one example of the configuration of the memory cell array and peripheral circuits thereof in the semiconductor device according to the second embodiment of the present invention.

FIG. 24 shows one example of the configuration of the memory cell array MCA and peripheral circuits thereof.

The sense amplifier columns SAA including a plurality of sense amplifiers are adjacently disposed on the upside and downside of the memory cell array MCA, and the sub-word driver columns SWDA including a plurality of sub-word drivers are adjacently disposed on the left and right sides of the MCA. The SAA and the SWDA are shared by the memory cell arrays MCA on the upside and downside and on the left side and right side, so that the chip area can be reduced. The row control circuit XP is disposed in the portion surrounded by the SAA and the SWDA. This row control circuit XP is also shared by the MCA on the upside and downside, so that the chip area can be reduced. The MCA is constituted of sub-memory blocks SMB disposed at desired intersections of a plurality of global bit lines GBL, a plurality of global source lines GSL and a plurality of bit line select signals BLS. The sub-memory block SMB is constituted of a sub-memory cell array SMCA and bit line/source line select switch arrays BLSLSA adjacently disposed on the upside and downside of the SMCA. The sub-memory blocks SMB arranged in the row direction are configured to be selected by the common word line WL and bit line select signal BLS. This has an advantage that the memory cells in the column direction can be simultaneously read at once while reducing the driving of the word line having large power consumption. Although the configuration in which one sense amplifier SA is used for one global bit line GBL and one global source line GSL has been shown as an example, the configuration in which a plurality of global bit lines share one sense amplifier in order to reduce the chip area is also possible. In this case, a global bit line select circuit block is necessary.

Figure 25:
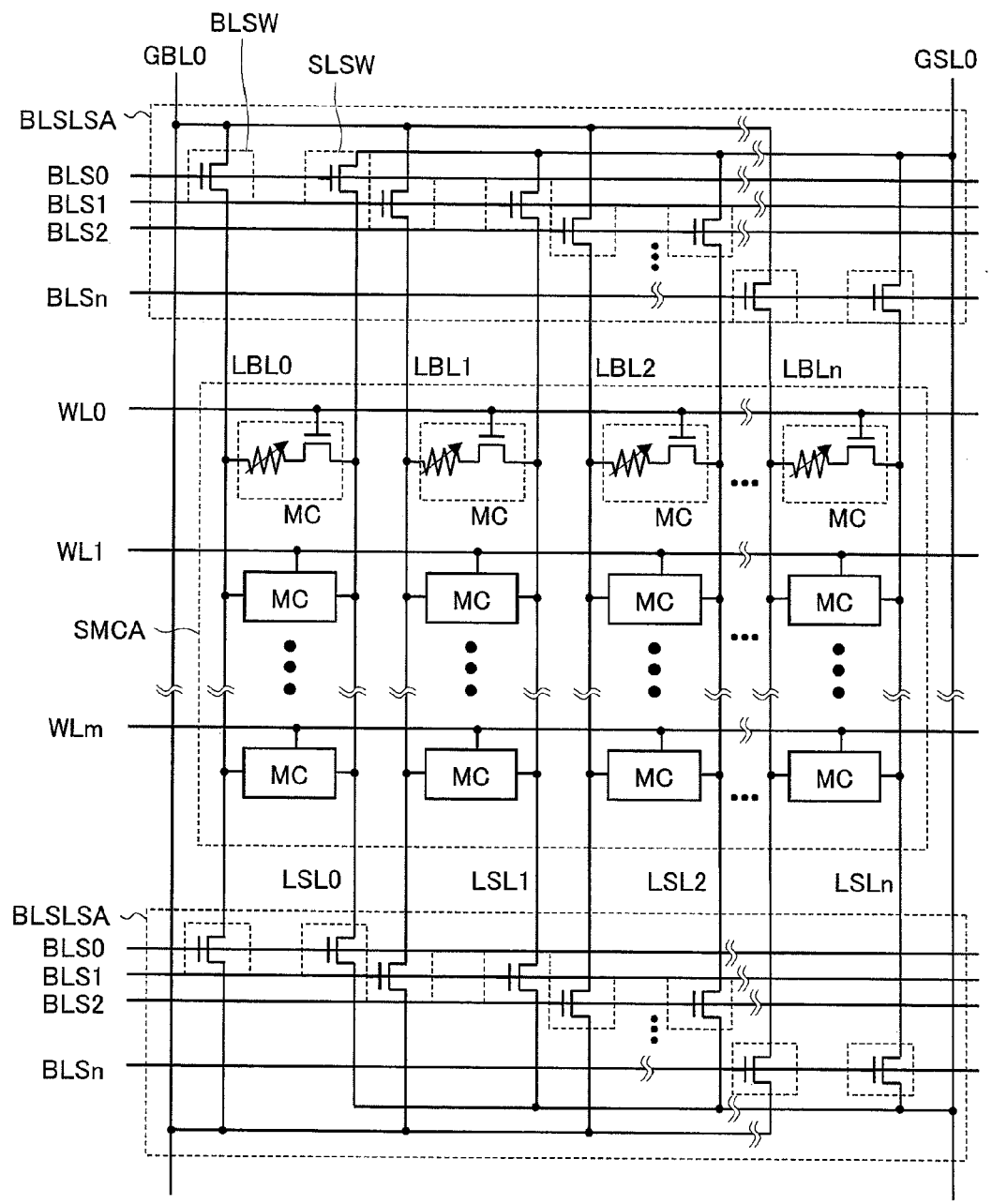
FIG. 25 is a view showing one example of the configuration of a sub-memory block in the semiconductor device according to the second embodiment of the present invention.

FIG. 25 shows one example of the configuration of the sub-memory block SMB.

The sub-memory cell array SMCA is constituted of m word lines WL, n local bit lines LBL, n local source lines LSL, and memory cells MC disposed at desired intersections of WL, LBL and LSL. The arrow mark inscribed on the resistance change element shows a direction of the current caused to flow in order to change the memory cell into a state of the logical value "1". The memory cell MC is constituted by using the resistance change element and the select element showing the current-voltage characteristics shown in FIG. 2B and FIG. 5. The memory cell using the resistance change element showing the current-voltage characteristics shown in FIG. 2B is characterized in that it is turned ON when the current is caused to flow from the local bit line LBL to the local source line LSL and the potential difference between the LBL and the LSL exceeds a low resistance (ON) threshold voltage, and it is turned OFF when the current is caused to flow from the LBL to the LSL and the potential difference between the LBL and the LSL exceeds a high resistance (OFF) threshold voltage. The memory cell using the resistance change element showing the current-voltage characteristics shown in FIG. 5 is characterized in that it is turned ON when the current is caused to flow from the LBL to the LSL and the potential difference between the LBL and the LSL exceeds an ON threshold voltage, and it is turned OFF when the current is caused to flow from the LSL to the LBL and the potential difference between the LSL and the LBL exceeds an OFF threshold voltage. Further, the above-described memory cell includes those characterized in that the resistance value after the rewriting changes depending on the magnitude of the rewriting current as shown in FIG. 7B.

The bit line/source line select switch arrays BLSLSA are adjacently disposed on the upside and downside of the sub-memory cell array SMCA in a direction of the local bit line LBL, and connect n local bit lines LBL of the SMCA to the global bit line GBL0 and connect n local source lines to the global source line GSL0. The BLSLSA is constituted of, for example, n bit line select switches BLSW and n source line select switches SLSW. The BLSW is constituted of, for example, one MOS transistor. In the MOS transistor, for example, the drain is connected to the global bit line GBL, the source is connected to the LBL, and the gate is controlled by the bit line select signal BLS. The SLSW is constituted of, for example, one MOS transistor. In the MOS transistor, for example, the drain is connected to the global source line GSL, the source is connected to the LSL, and the gate is controlled by the bit line select signal BLS.

Figure 26:
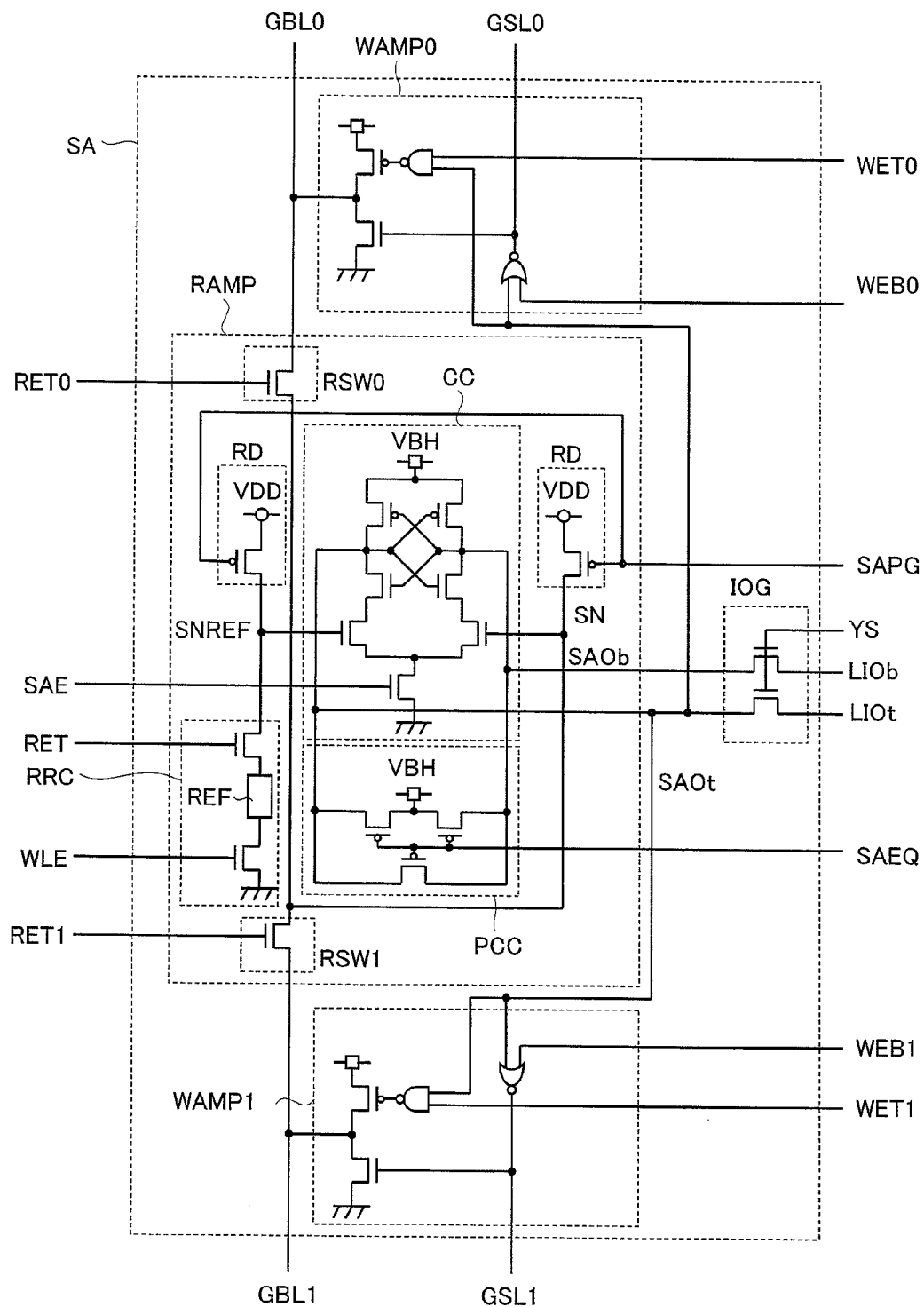
FIG. 26 is a view showing one example of the configuration of a sense amplifier in the semiconductor device according to the second embodiment of the present invention.

FIG. 26 shows one example of the configuration of the sense amplifier SA.

The sense amplifier SA is constituted of a reading portion RAMP, a writing portion WAMP and a local input-output line switch IOG. The RAMP and the IOG are shared by a writing portion WAMP0 to drive the global bit line GBL0 on the upside of the sense amplifier and a writing portion WAMP1 to drive the global bit line GBL1 on the downside of the sense amplifier. This helps to reduce the area of the sense amplifier circuit. The WAMP and the RAMP are connected by an active high sense amplifier out signal line SAOt and the global bit line GBL. The IOG and the RAMP are connected by the SAOt and the SAOb. The IOG and the WAMP are connected by the SAOt.

The reading portion RAMP is constituted of, for example, a read switch RSW, two read drivers RD, a cross couple CC, a pre-charge circuit PCC and a reading reference circuit RRC. The RRC is constituted of, for example, two MOS transistors and a reference load REF and is controlled by a read enable signal RET and a word line enable signal WLE. The RSW0 is controlled by an upper memory cell read enable signal RET0. The RSW1 is controlled by a lower memory cell read enable signal RET1. The CC is controlled by a sense amplifier enable signal SAE. The RD is controlled by a reading current control signal SAPG. The PCC is controlled by a sense amplifier equalizing signal SAEQ. The PCC is a pre-charge circuit for charging the SAOt and the SAOb to the VBH at the standby time and is controlled by the SAEQ.

In the following, the operation of the RAMP in the reading will be described. First, the sense amplifier equalizing signal SAEQ transitions to high from low, and the pre-charge is terminated. Next, the reading current is caused to flow to the memory cell. The reading current is determined by a PMOS load whose gate potential is controlled by the VDD and the SAPG. When the memory cell on the upside of the SA is read, the RET0 is selected, and when the memory cell on the downside of the SA is read, RET1 is selected. The reading current flows through the load PMOS from the VDD to pass through a sense node SN to the global bit line selected by the RET0 or the RET1. The current for reference flows through the load PMOS from the VDD to pass through a reference sense node SNREF to a ground potential through the reference load REF simulated as the current path to the memory cell. When the resistance value of the memory cell to be read is high, that is, when the logical value is "0", the potential of the SN is higher than the potential of the SNREF. This is because a voltage drop at the memory cell is larger than a voltage drop at the REF. The SAOt is amplified to the voltage VBH and the SAOb is amplified to the ground potential by a cross couple activated by the sense amplifier enable signal SAE, and the potential difference between the SN and the SNREF corresponds to the difference between the voltage VBH and the ground potential. When the resistance value of the memory cell to be read is low, that is, when the logical value is "1", the potential of the SN is lower than the potential of the SNREF. This is because a voltage drop at the memory cell is smaller than a voltage drop at the REF. The SAOt is amplified to the ground potential and the SAOb is amplified to the voltage VBH by the cross couple, and the potential difference between the SN and the SNREF corresponds to the difference between the ground potential and the voltage VBH. The memory information read to the SAOt and the SAOb by a column select line YS is read to the local input-output line LIOt and the LIOb.

In the following, the operation of the writing portion WAMP will be described. When the memory is put into a high resistive state, that is, when the logical value "0" is to be written, if the column select line YS is selected, the SAOt is charged toward the ground potential by the LIOt, and the SAOb is charged toward the VBH by the LIOb. Since the RET is low, the SN and the SNREF are charged to the potential close to the VDD, and when the SAE is turned ON, the SAOt is charged to the ground potential and the SAOb is charged to the VBH by the cross couple. When an active high write enable signal WET and an active low write enable signal (inversion) WEB are activated, since the SAOt is low, the GBL is charged to the ground potential and the global source line GSL is charged to the VBH by the WAMP. The current flows from the GSL to the GBL, and the logical value "0" is written to the memory cell. When the memory is put into a low resistive state, that is, when the logical value "1" is to be written, if the column select line YS is selected, the SAOt is charged toward the VBH by the LIOt, and the SAOb is charged toward the ground potential by the LIOb. Since the RET is low, the SN and the SNREF are charged to the potential close to the VDD, and when the SAE is turned ON, the SAOt is charged to the VBH and the SAOb is charged to the ground potential by the cross couple. When an active high write enable signal WET and an active low write enable signal WEB are activated, since the SAOt is high, the GBL is charged to the VBH and the GSL is charged to the ground potential by the WAMP. The current flows from the GBL to the GSL, and the logical value "1" is written to the memory cell.

Figure 27:
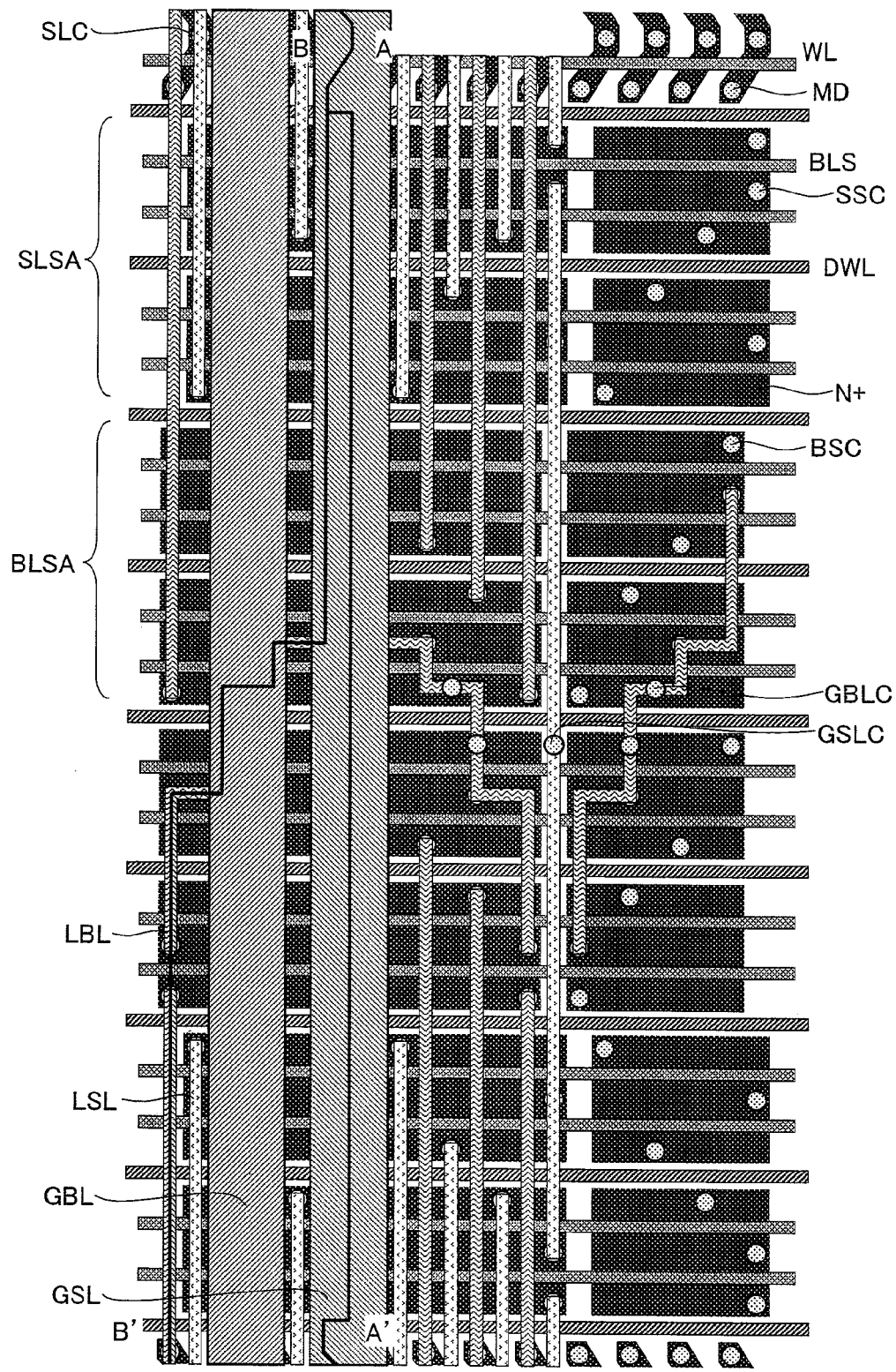
FIG. 27 is a view showing one example of a layout of a sub-memory cell array and bit line/source line select switch arrays adjacently disposed on its downside and upside in the semiconductor device according to the second embodiment of the present invention.

FIG. 27 shows one example of the layout of the bit line/source line select switch array BLSLSA adjacent on the downside of the sub-memory cell array SMCA and the BLSLSA adjacent on the upside of the SMCA. FIG. 27 corresponds to a circuit diagram in which the lower end of the SMCA and the BLSLSA on the downside and the upper end of the SMCA and the BLSLSA on the upside are arranged in the row direction in the sub-memory block SMB shown in FIG. 24.

The memory cell is the same as that shown in FIG. 20, and therefore, the description thereof will be omitted.

Since the bit line select switch is constituted of four LBL for one GBL in this case, it is constituted of, for example, four MOS transistors. The gate of the transistor corresponds to the bit line select line BLS, and this is disposed at the same pitch as the word line WL of the memory cell MC. The bit line select switch shares a contact for connecting to the global bit line by two MOS transistors. Therefore, the area of the diffusion layer $N^+$ is $35F^2$ with the two MOS transistors. This has an effect that the large gate width can be taken and the ON resistance of the bit line select switch can be reduced. The adjacent diffusion layers are separated by the dummy word line DWL. As a result, it is possible to fabricate the gate and the dummy word line of the bit line select switch portion in quite the same manner as the repetitive patterns of the WL and the DWL of the memory cell array. By this means, the fabrication of the bit line select switch is facilitated. A total of eight local bit lines from the upside SMCA and from the downside SMCA are bundled together in the same node by the bit line select switch and are connected from this node to the global bit line GBL through a global bit line contact GBLC for connecting to the global bit line.

Since the source line select switch is constituted of four LSL for one GSL in this case, it is constituted of, for example, four MOS transistors. The gate of the transistor corresponds to the bit line select line BLS, and this is disposed at the same pitch as the word line WL of the memory cell MC. The source line select switch shares a contact for connecting to the global source line by two MOS transistors. Therefore, the area of the diffusion layer N+ is $35F^2$ with the two MOS transistors. This has an effect that the large gate width can be taken and the ON resistance of the source line select switch can be reduced. The adjacent diffusion layers are separated by the dummy word line DWL. As a result, it is possible to fabricate the gate and the dummy word line of the source line select switch portion in quite the same manner as the repetitive patterns of the WL and the DWL of the memory cell array. By this means, the fabrication of the source line select switch is facilitated. A total of eight local bit lines from the upside SMCA and from the downside SMCA are bundled together in the same node by the source line select switch and are connected from this node to the global source line GSL through a global source line contact GSLC for connecting to the global source line.

Figure 28A:
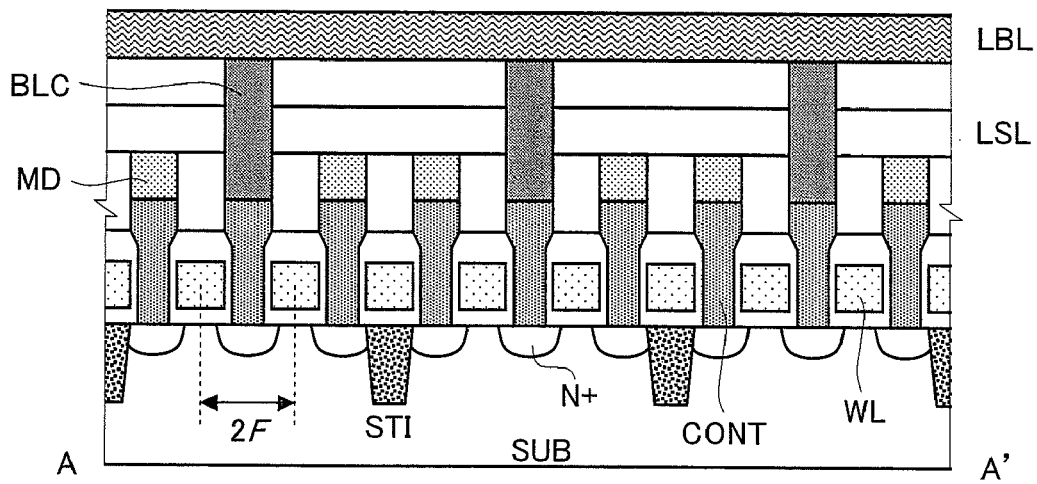
FIG. 28A is a view showing one example of a cross section of the sub-memory cell array in the semiconductor device according to the second embodiment of the present invention.
Figure 28B:
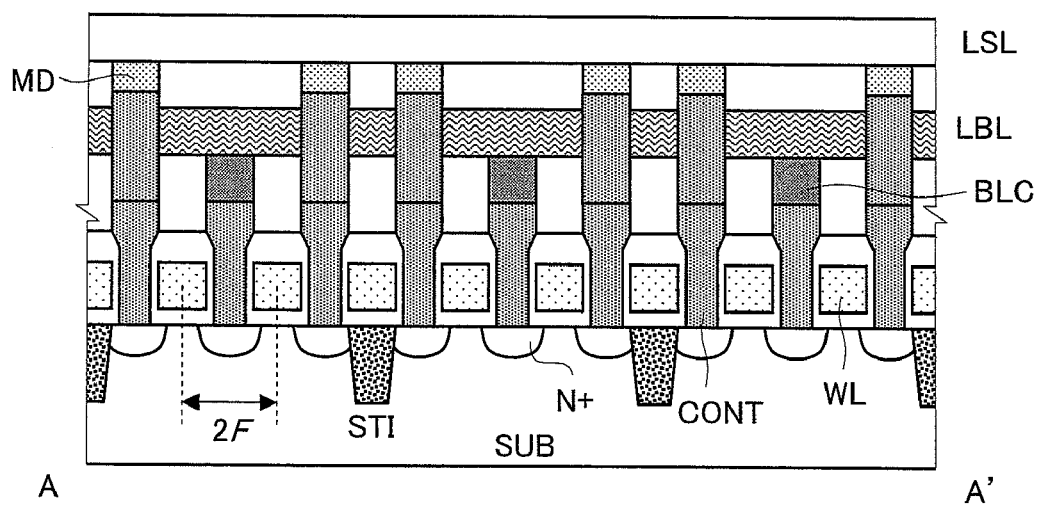
FIG. 28B is a view showing one example of a cross section of the sub-memory cell array in the semiconductor device according to the second embodiment of the present invention.
Figure 28C:
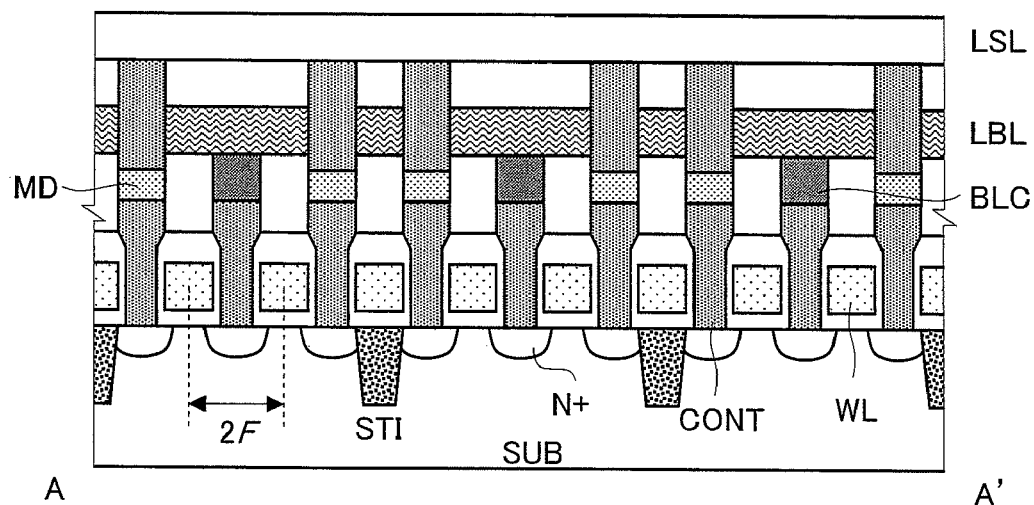
FIG. 28C is a view showing one example of a cross section of the sub-memory cell array in the semiconductor device according to the second embodiment of the present invention.

FIG. 28 shows examples of the cross section of the sub-memory cell array SMCA. FIG. 28A to FIG. 28C are cross sectional views of a portion of the SMCA taken along the line from A to A' in FIG. 27.

FIG. 28A shows an example where the local bit line LBL is arranged in a layer upper than the local source line LSL, and FIG. 28B shows an example where the local bit line LBL is arranged in a layer lower than the local source line LSL and a resistance change element is arranged in a layer upper than the local bit line LBL. FIG. 28C shows an example where the local bit line LBL is arranged in a layer lower than the local source line LSL and the resistance change element is arranged in a layer lower than the local bit line LBL. The structure shown in FIG. 28B is considered to have an improved yield because the number of manufacturing processes to the layers higher than the resistance change element is small.

Figure 29:
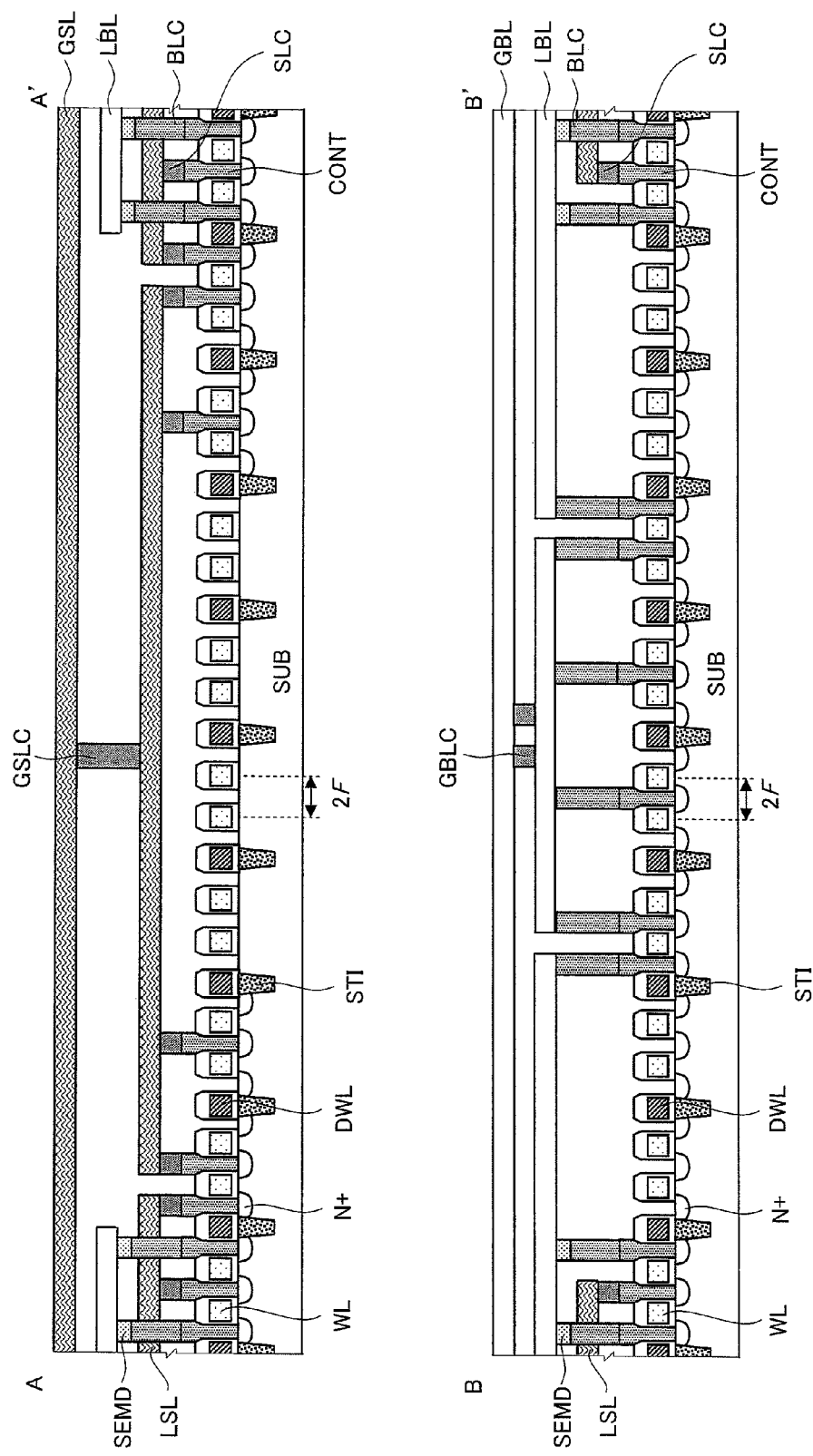
FIG. 29 is a view showing one example of a cross section of the bit line/source line select switch array in the semiconductor device according to the second embodiment of the present invention.

FIG. 29 shows one example of a cross section of the bit line/source line select switch array BLSLSA. FIG. 29 is a cross sectional view taken along the line from A to A' and a cross sectional view taken along the line from B to B' in FIG. 27.

Since the gates of the MOS transistors of the bit line select switch and the source line select switch are fabricated by the same pattern as the word line WL in the memory cell array, they are inscribed as WL. The local source lines LSL are bundled together in a first layer of the wiring layers and are connected from the bundled node to the global source line GSL of a third layer of the wiring layers by the global source line contact GSLC. The local bit lines LBL are bundled in a second layer of the wiring layers and are connected from the bundled node to the global bit line GBL of a third layer of the wiring layers by a global bit line contact GBLC. Since the GSLC is passed through from the first layer to the third layer of the wiring layers, for example, the wiring of the portion to bundle the LBL in the second wiring layer is preferably formed obliquely in the layout of FIG. 27. It is preferable to dispose two or more GBLC so as to reduce the resistance value, for example.

As described above, the semiconductor device according to the second embodiment includes: the first and second bit line/source line select switch arrays BLSLSA having a plurality of bit line select switches BLSW and a plurality of source line select switches SLSW; and the sub-memory cell array SMCA adjacently disposed between the first and second bit line/source line select switch arrays BLSLSA and having a plurality of local bit lines LBL, a plurality of local source lines LSL, a plurality of word lines WL and a plurality of memory cells MC disposed at intersections of the plurality of word lines WL, the plurality of local bit lines LBL and the plurality of local source lines LSL, wherein the local bit lines LBL are connected to the global bit line GBL in the first and second bit line/source line select switch arrays BLSLSA, the local source lines LSL are connected to the global source lines GSL in the first and second bit line/source line select switch arrays BLSLSA, and thus, the control method of the bit line select switch BLSW and the source line select switch SLSW can be changed in the writing and the reading, so that the rewriting current can be increased without increasing the power supply voltage, and at the same time, the location dependency inside the memory cell array of the resistive state after the rewriting can be reduced.

Third Embodiment

A semiconductor device according to a third embodiment will be described with reference to FIG. 30 to FIG. 35.

Figure 30:
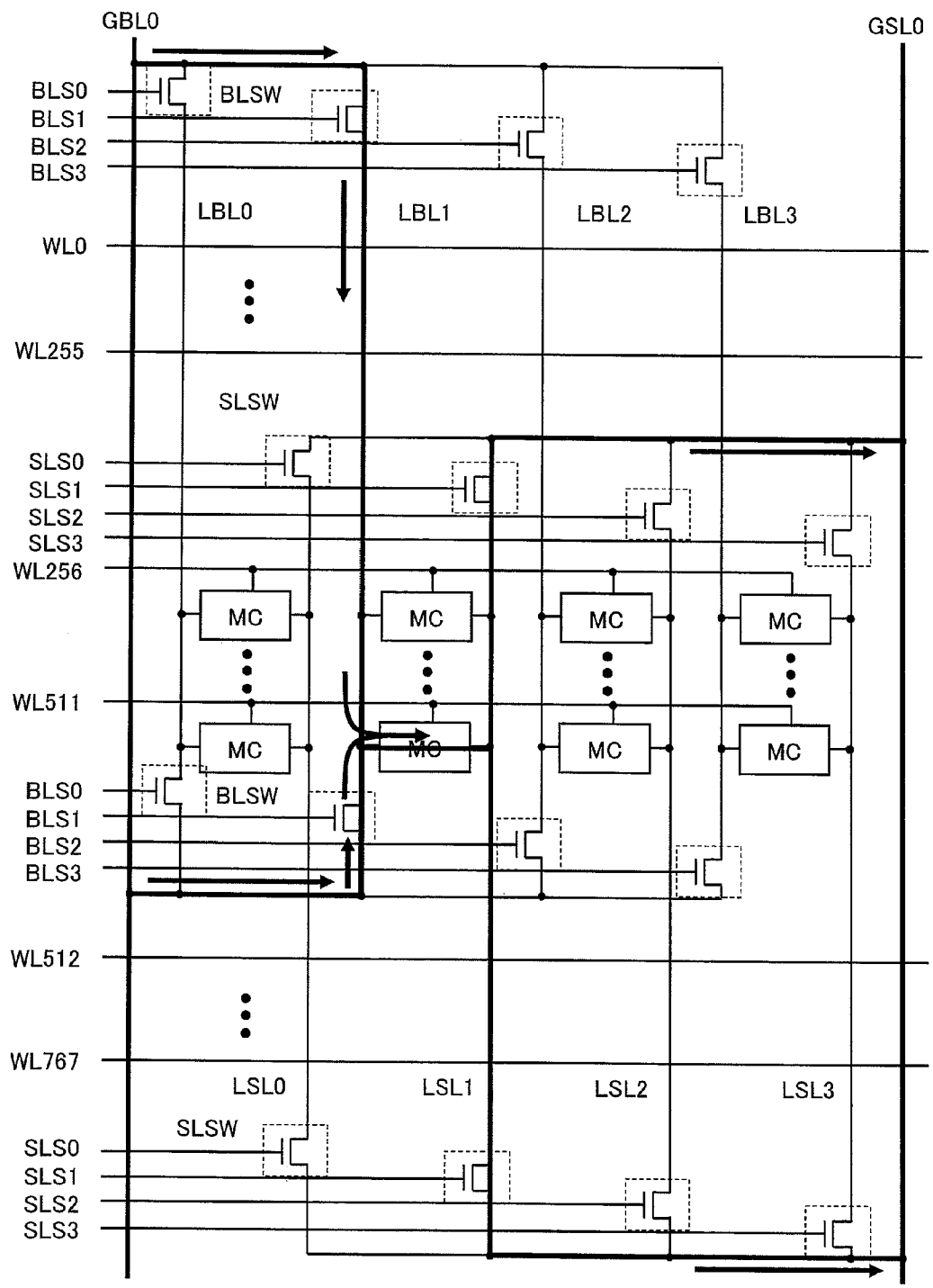
FIG. 30 is a view showing one example of the operation of the memory cell array in a semiconductor device according to a third embodiment of the present invention.

FIG. 30 shows one example of the operation of a memory cell array in the semiconductor device according to the third embodiment.

The thick line of FIG. 30 shows a path of the current flowing into the array when information of the memory cell MC disposed at the intersection of the word line WL511 and the local bit line LBL1 is rewritten (written) from, for example, a logical value "0" to "1". When the connecting direction of a resistance change element is reversed, the rewriting from the logical value "1" to "0" can be performed with the same direction as the rewriting current shown in FIG. 30. A select element of the MC is constituted of, for example, one MOS transistor, and the source side is connected to a local source line LSL and the drain is connected to the resistance change element. A global bit line GBL0 is charged to a rewriting potential higher than a global source line GSL by a driver circuit. The GSL is charged to, for example, a ground potential. By taking an AND logic of a mat select signal and a rewriting enable signal, a bit line select line BLS1 and a source line select line SLS1 are selected. As a result, the bit line select switches BLSW connected to both ends of the local bit line LBL1 and the source line select switches SLSW connected to both ends of the local source line LSL1 are turned ON.

In the layout of FIG. 30, the local source line LSL1 is connected to the global source line GSL0 through two switches SLSW. The layout of the present embodiment is characterized in that the local source line is connected to the global source line through two source line switches provided at both ends thereof. As a result, two current paths from the local source line to the global source line are provided in parallel, so that the parasitic resistance component from the memory cell until reaching the global source line can be suppressed. Consequently, like the above-described case where the local bit line is connected to the global bit line through the two bit line select switches, high current can be caused to flow in the writing, and the large margin can be ensured in the reading.

Further, as compared with the second embodiment, the third embodiment is characterized in that the arrangement of the bit line select switch array and the arrangement of the source line select switch array are shifted with respect to the memory cell MC. For example, in FIG. 30, in the case of the configuration where the bit line select switch array and the source line select switch array are disposed for each 512 word lines, the layout of the bit line select switch array and the source line select switch array is shifted by 256 word lines, that is, by half the 512 word lines. In such a configuration, even if 512 word lines exist between respective switches, the actual lengths of the LSL and the LBL in the current path can be reduced by half, that is, from 512 word lines WL to 256 word lines WL, so that parasitic resistance component can be reduced. The rewriting current flows from the global bit line GBL0 through the bit line select switches connected to both ends of the local bit line LBL1 to the local bit line LBL1 in parallel, flows to the local source line LSL1 through the memory cell MC, and further flows to the global source line GSL0 from the source line select switches connected to both ends of the LSL1. Two current paths from the GBL0 to the LBL1 are provided in parallel, and two current paths from the LSL1 to the GSL0 are also provided in parallel, and therefore, the parasitic resistance component in the current path can be suppressed. As a result, the high current necessary for the rewriting can be caused to flow to the MC. Further, in the writing, the switches may be controlled in the following manner. That is, depending on the selected word line, the bit line select switch located at the upper end of the LBL1 and the source line select switch located at the lower end of the LSL1 only are turned ON, or the bit line select switch located at the lower end of the LBL1 and the source line select switch located at the upper end of the LSL1 only are turned ON and the remaining switches are turned OFF. This has an advantage of being able to reduce the location dependency inside the array of the parasitic resistance component of the memory cell MC in the reading, and moreover, to reduce the parasitic resistance component. More specifically, this is because, when the bit line select switch and the source line select switch are turned ON as described above, the lengths of the LBL and the LSL in the reading current path can be made equal without depending on the row address of the memory cell.

In the reading, the GBL0 is charged to reading potential by the driver circuit, and the current is caused to flow through the same current path as the rewriting. In that case, the bit line select line BLS1 is selected from a mat select signal and a read enable signal. The reading current reaches the MC through two paths in parallel from the global bit line GBL0 to the local bit line LBL1, and flows to the global source line GSL0 through two paths in parallel from the local source line LSL1. Further, in the reading, the switches may be controlled in the following manner. That is, depending on the selected word line, the bit line select switch located at the upper end of the LBL1 and the source line select switch located at the lower end of the LSL1 only are turned ON, or the bit line select switch located at the lower end of the LBL1 and the source line select switch located at the upper end of the LSL1 only are turned ON and the remaining switches are turned OFF. This has an advantage of being able to reduce the location dependency inside the array of the parasitic resistance component of the memory cell MC in the reading, and moreover, to reduce the parasitic resistance component. More specifically, this is because, when the bit line select switch and the source line select switch are turned ON as described above, the lengths of the LBL and the LSL in the reading current path can be made equal without depending on the row address of the memory cell.

Figure 31:
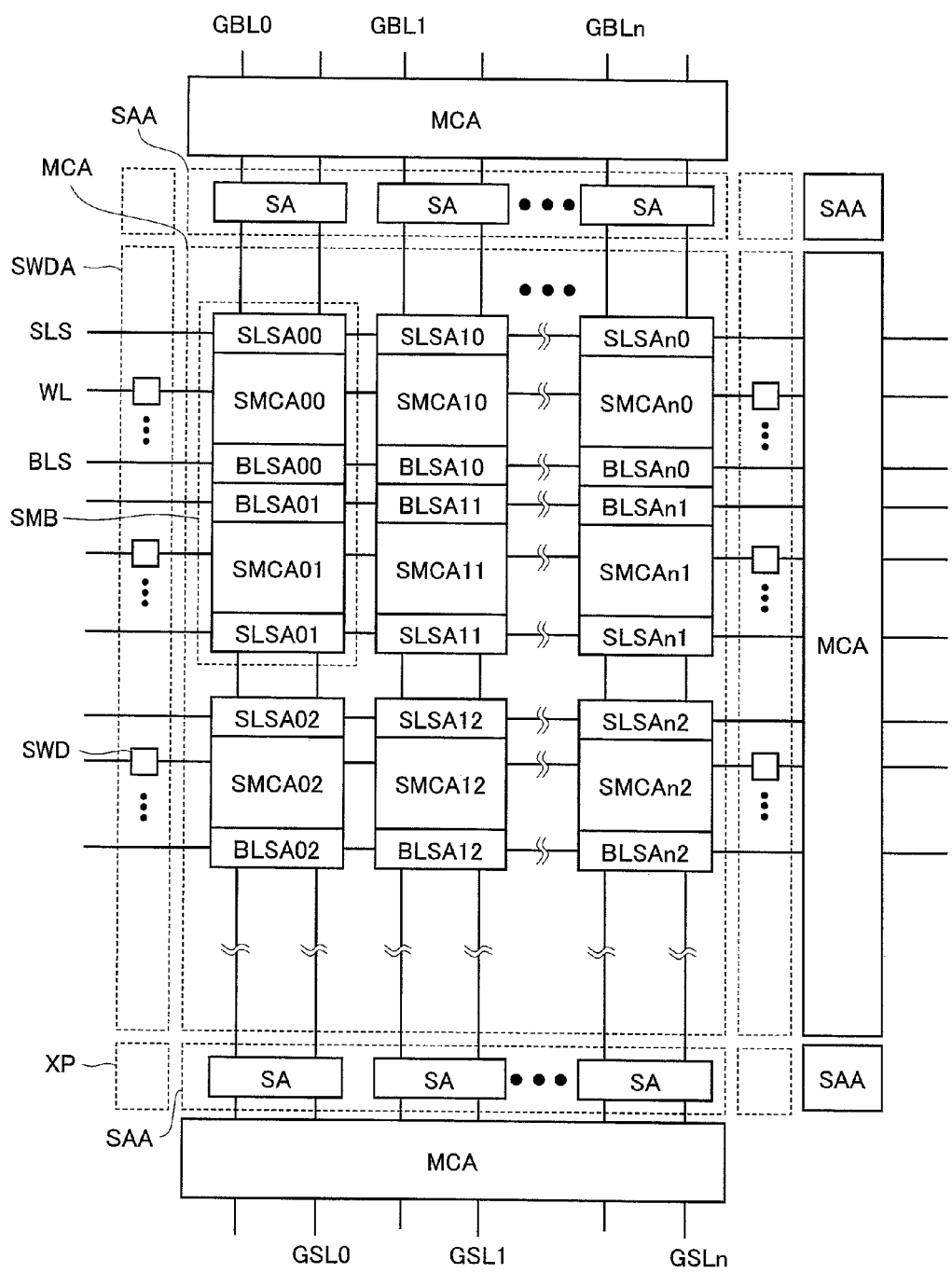
FIG. 31 is a view showing one example of the configuration of a memory cell array and peripheral circuits thereof in the semiconductor device according to the third embodiment of the present invention.

FIG. 31 shows one example of the configuration of the memory cell array MCA and peripheral circuits thereof.

The sense amplifier columns SAA including a plurality of sense amplifiers are adjacently disposed on the upside and downside of the memory cell array MCA, and the sub-word driver columns SWDA including a plurality of sub-word drivers are adjacently disposed on the left and right sides of the MCA. The SAA and the SWDA are shared by the memory cell arrays MCA on the upside and downside and on the left side and right side, so that the chip area can be reduced. The row control circuit XP is disposed in the portion surrounded by the SAA and the SWDA. This row control circuit XP is also shared by the MCA on the upside and downside, so that the chip area can be reduced. The MCA is constituted of sub-memory blocks SMB disposed at desired intersections of a plurality of global bit lines GBL, a plurality of global source lines GSL and a plurality of bit line select signals BLS. The sub-memory block SMB is constituted of, for example, two sub-memory cell arrays SMCA, two bit line select switch arrays BLSA adjacently disposed so as to be sandwiched between the SMCA, and source line select switch arrays SLSA adjacently disposed on an upside of the upper SMCA and on the downside of the lower SMCA. The configuration of the SMB may be such that the arrangements of the BLSA and the SLSA are counterchanged. When the SMB is repeated in the column direction, the configuration where two BLSA adjacently sandwiched between two SMCA and two SLSA adjacently sandwiched between two SMCA are repeated is provided. The sub-memory blocks SMB arranged in the row direction are configured to be selected by the common word line WL and bit line select signal BLS. This has an advantage that the memory cells in the column direction can be simultaneously read at once while reducing the driving of the word line having large power consumption. Although the configuration in which one sense amplifier SA is used for one global bit line GBL and one global source line GSL has been shown as an example, the configuration in which a plurality of global bit lines share one sense amplifier in order to reduce the chip area is also possible. In this case, a global bit line select circuit block is necessary.

Figure 32:
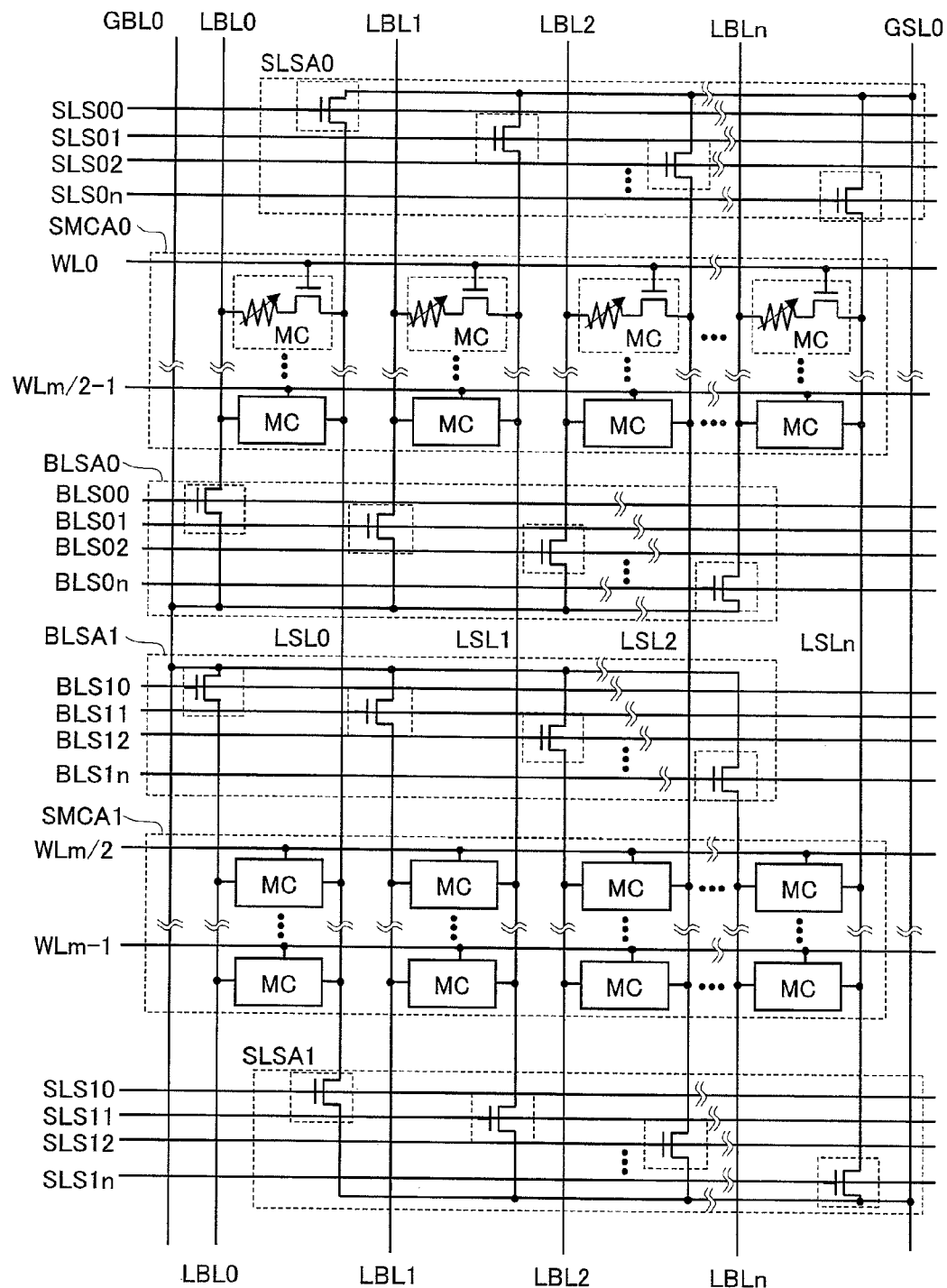
FIG. 32 is a view showing one example of the configuration of a sub-memory block in the semiconductor device according to the third embodiment of the present invention.

FIG. 32 shows one example of the configuration of the sub-memory block SMB.

Each of the two sub-memory cell arrays SMCA are constituted of m/2 word lines WL, n local bit lines LBL, n local source lines LSL, and memory cells MC disposed at desired intersections of WL, LBL and LSL. The arrow mark inscribed on the resistance change element shows a direction of the current caused to flow in order to change the memory cell into a state of the logical value "1". The memory cell MC is constituted by using the resistance change element and the select element showing the current-voltage characteristics shown in FIG. 2B and FIG. 5. The memory cell using the resistance change element showing the current-voltage characteristics shown in FIG. 2B is characterized in that it is turned ON when the current is caused to flow from the local bit line LBL to the local source line LSL and the potential difference between the LBL and the LSL exceeds a low resistance (ON) threshold voltage, and it is turned OFF when the current is caused to flow from the LBL to the LSL and the potential difference between the LBL and the LSL exceeds a high resistance (OFF) threshold voltage. The memory cell using the resistance change element showing the current-voltage characteristics shown in FIG. 5 is characterized in that it is turned ON when the current is caused to flow from the LBL to the LSL and the potential difference between the LBL and the LSL exceeds an ON threshold voltage, and it is turned OFF when the current is caused to flow from the LSL to the LBL and the potential difference between the LSL and the LBL exceeds an OFF threshold voltage. Further, the above-described memory cell includes those characterized in that the resistance value after the rewriting changes depending on the magnitude of the rewriting current as shown in FIG. 7B.

The source line select switch arrays SLSA are adjacently disposed on the upside of the upper sub-memory cell array SMCA in the local source line LSL direction and on the downside of the lower SMCA in the local source line LSL direction, and connect n local source lines LSL of the SMCA to the global source line GSL0. The two bit line select switch arrays are disposed so as to be sandwiched between the two SMCA and connect n local bit lines to the global bit line GBL0. The BLSA and the SLSA are constituted of, for example, n bit line select switches BLSW and n source line select switches SLSW. The BLSW is constituted of, for example, one MOS transistor. In the MOS transistor, for example, the drain is connected to the global bit line GBL, the source is connected to the LBL, and the gate is controlled by the bit line select signal BLS. The SLSW is constituted of, for example, one MOS transistor. In the MOS transistor, for example, the drain is connected to the global source line GSL, the source is connected to the LSL, and the gate is controlled by the source line select signal SLS. Of the source line select signals SLS, the SLS0$n$ and its corresponding SLS1$n$ are selected by the same select line.

Figure 33:
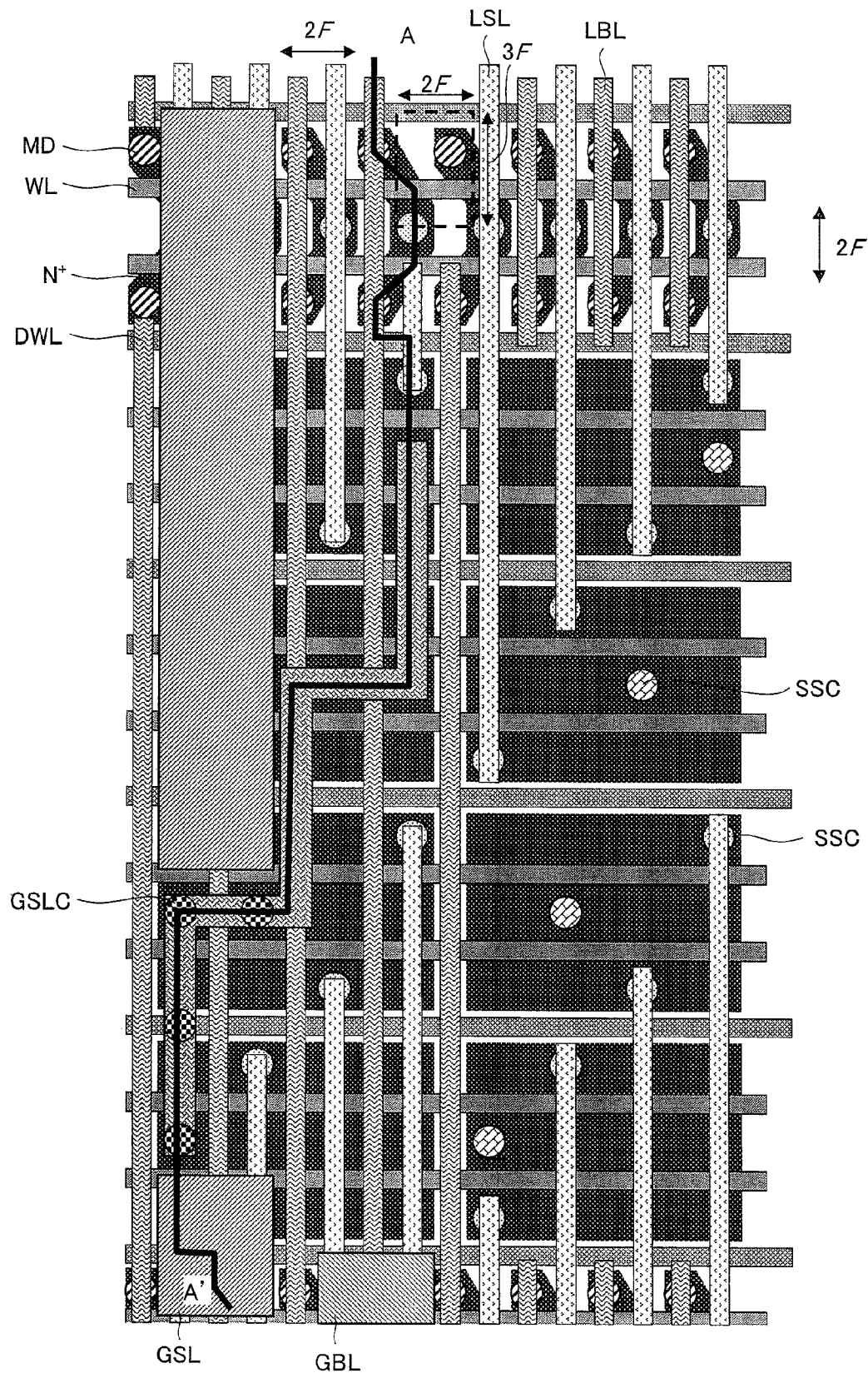
FIG. 33 is a view showing one example of the layout when two source line select switch arrays are arranged in the semiconductor device according to the third embodiment of the present invention.

FIG. 33 shows one example of the layout when two source line select switch arrays SLSA shown in FIG. 32 are arranged.

The memory cell is the same as that shown in FIG. 20, and therefore, the description thereof will be omitted.

Since the source line select switch is constituted of four LSL for one GSL in this case, it is constituted of, for example, four MOS transistors. The gate of the transistor corresponds to the source line select line SLS, and this is disposed at the same pitch as the word line WL of the memory cell MC. The source line select switch shares a contact for connecting to the global source line by two MOS transistors. Therefore, the area of the diffusion layer N$^+$ is 35F$^2$ with the two MOS transistors. This has an effect that the large gate width can be taken and the ON resistance of the source line select switch can be reduced. The adjacent diffusion layers are separated by the dummy word line DWL. As a result, it is possible to fabricate the gate and the dummy word line of the source line select switch portion in quite the same manner as the repetitive patterns of the WL and the DWL of the memory cell array. By this means, the fabrication of the source line select switch is facilitated. A total of eight local source lines from the upside SMCA and from the downside SMCA are bundled together in the same node by the source line select switch and are connected from this node to the global source line GSL through a global source line contact GSLC for connecting to the global source line. By providing a plurality of GSLC, the parasitic resistance component can be reduced.

Figure 34:
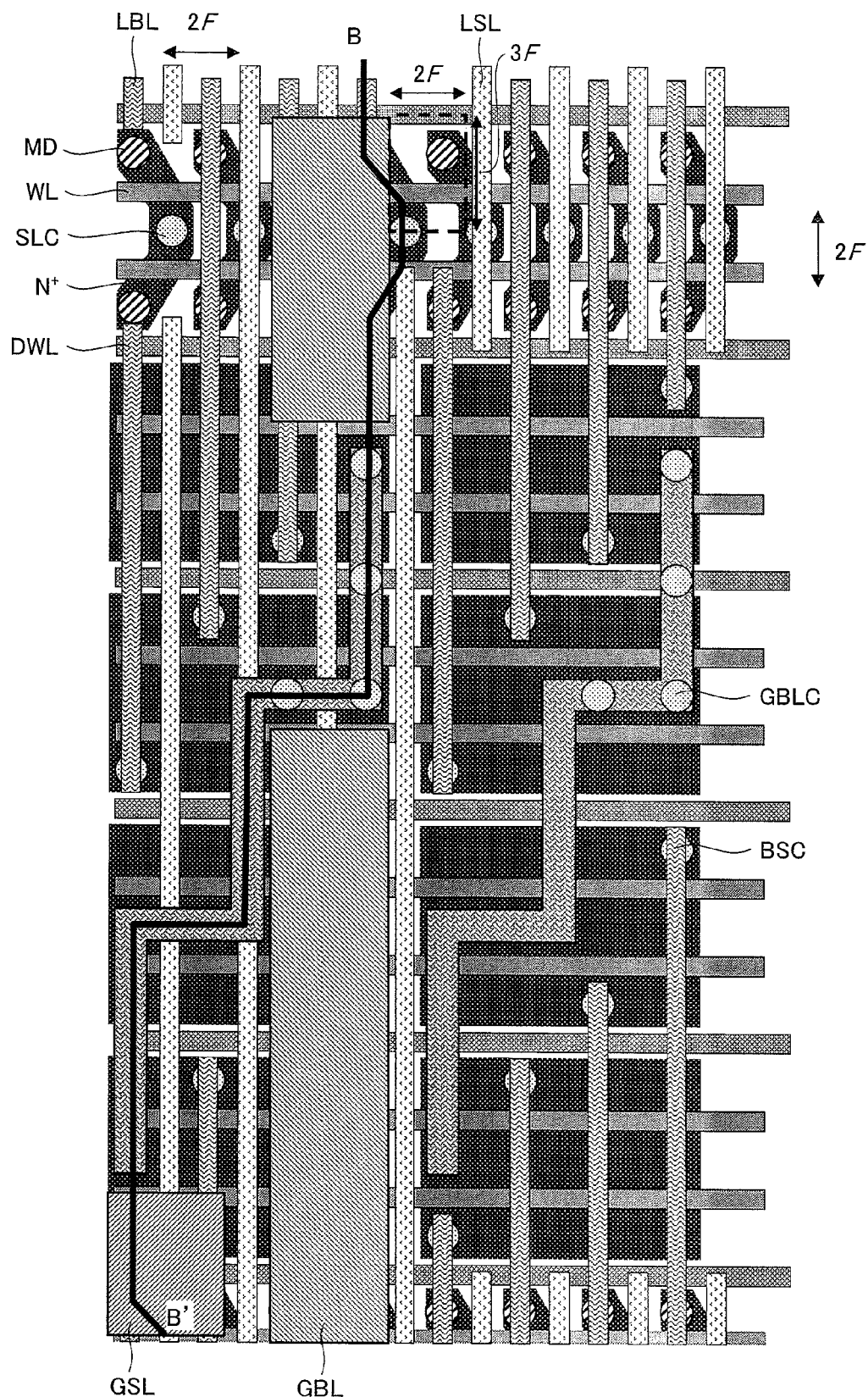
FIG. 34 is a view showing one example of the layout when two bit line select switch arrays are arranged in the semiconductor device according to the third embodiment of the present invention.

FIG. 34 shows one example of a layout when twp bit line select switch arrays BLSA shown in FIG. 32 are arranged.

The memory cell is the same as that shown in FIG. 20, and therefore, the description thereof will be omitted.

Since the bit line select switch is constituted of four LBL for one GBL in this case, it is constituted of, for example, four MOS transistors. The gate of the transistor corresponds to the bit line select line SLS, and this is disposed at the same pitch as the word line WL of the memory cell MC. The bit line select switch shares a contact for connecting to the global bit line by two MOS transistors. Therefore, the area of the diffusion layer N$^+$ is 35F$^2$ with the two MOS transistors. This has an effect that the large gate width can be taken and the ON resistance of the bit line select switch can be reduced. The adjacent diffusion layers are separated by the dummy word line DWL. As a result, it is possible to fabricate the gate and the dummy word line of the bit line select switch portion in quite the same manner as the repetitive patterns of the WL and the DWL of the memory cell array. By this means, the fabrication of the bit line select switch is facilitated. A total of eight local bit lines from the upside SMCA and from the downside SMCA are bundled together in the same node by the bit line select switch and are connected from this node to the global bit line GBL through a global bit line contact GBLC for connecting to the global bit line. By providing a plurality of GBLC, the parasitic resistance component can be reduced.

Figure 35:
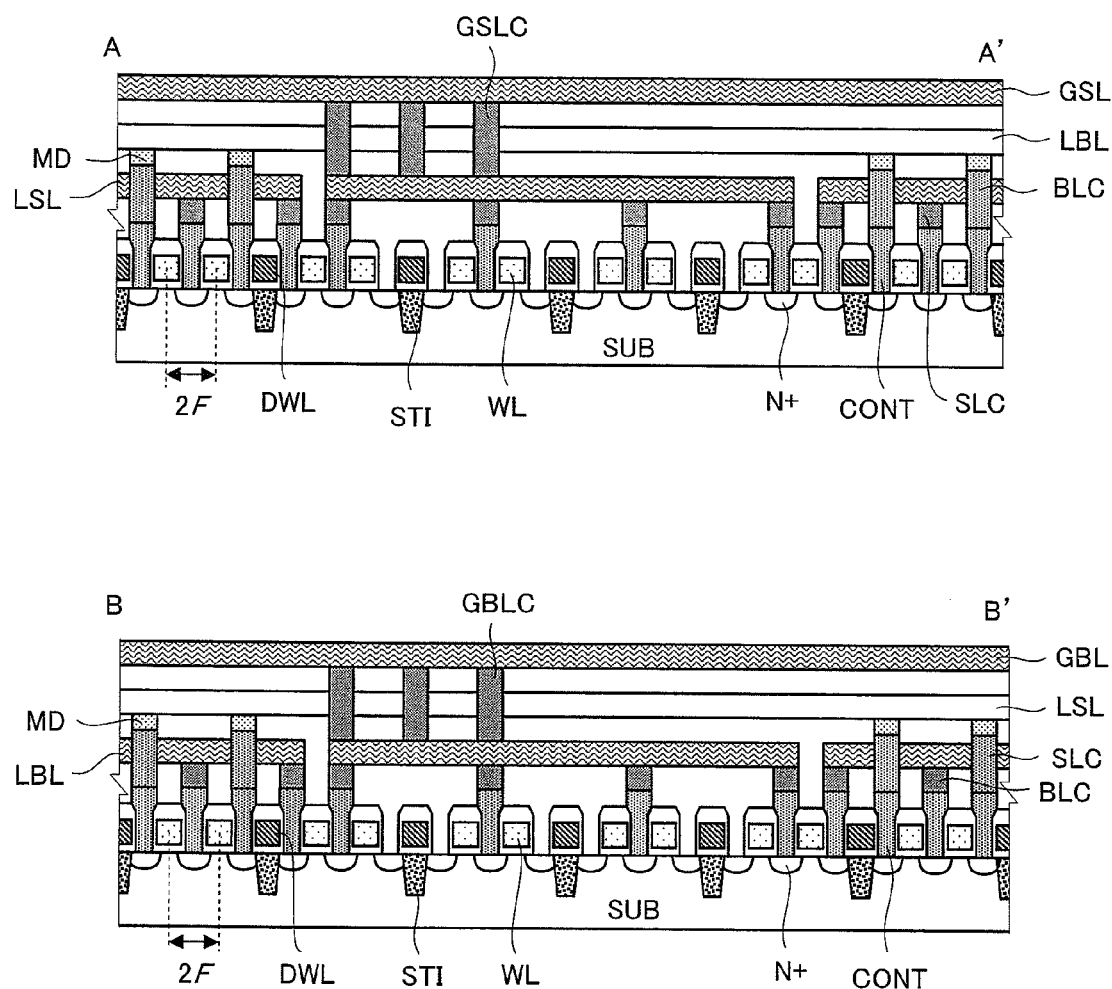
FIG. 35 is a view showing one example of the cross section of the source line select switch array and one example of the cross section of the bit line select switch array in the semiconductor device according to the third embodiment of the present invention.

FIG. 35 shows a cross sectional view taken along the line from A to A' of the source line select switch array shown in FIG. 33 and a cross sectional view taken along the line from B to B' of the bit line select array shown in FIG. 34.

Since the gates of the MOS transistors of the bit line select switch and the source line select switch are fabricated by the same pattern as the word line WL in the memory cell array, they are inscribed as WL. In the source line select switch array, the local source lines LSL are bundled together in a first layer of the wiring layers and connected from the bundled node to the global source line GSL of a third layer of the wiring layers by a global source line contact GSLC. In the bit line select switch array, the local bit lines LBL are bundled together in a second layer of the wiring layers and connected from the bundled node to the global bit line GBL of the third layer of the wiring layers by a global bit line contact GBLC. It is preferable to dispose two or more GBLC and GSLC so as to reduce the resistance value, for example.

As described above, the semiconductor device according to the third embodiment includes: the bit line select switch array BLSA having a plurality of bit line select switches BLSW; the source line select switch array SLSA having a plurality of source line select switches SLSW; and the sub-memory cell array adjacently disposed between the bit line select switch array BLSA and the source line select switch array SLSA and having a plurality of local bit lines LBL, a plurality of local source lines LSL, a plurality of word lines WL and a plurality of memory cells MC disposed at intersections of the plurality of word lines WL, the plurality of local bit lines LBL and the plurality of local source lines LSL, wherein, when the above-described configuration is taken as one repetitive unit, one end of the local bit line LBL is connected to the global bit line GBL in the bit line select switch BLSW and the other end thereof is connected to the global bit line GBL in the bit line select switch BLSW included in the repetitive unit adjacent in the local bit line direction, and one end of the local source line LSL is connected to the global source line GSL in the source line select switch SLSW and the other end thereof is connected to the global source line GSL in the source line select switch SLSW included in the repetitive unit adjacent in the local source line direction, and thus, the control method of the bit line select switch BLSW and the control method of the source line select switch SLSW can be changed in the writing and the reading, so that the rewriting current can be increased without increasing the power supply voltage, and at the same time, the location dependency inside the memory cell array of the resistive state after the rewriting can be reduced.

Hereinafter, embodiments of the present invention will be described in detail with reference to the accompanying drawings. Note that components having the same function are denoted by the same reference numbers throughout the drawings for describing the embodiments, and the repetitive description thereof will be omitted.

The semiconductor device according to the present invention is a technique particularly useful when applied to the resistance change memory, and other than this, it can be also applied to an on-chip memory incorporated in a logic chip such as a microprocessor and a DSP (Digital Signal Processor) and the like.

What is claimed is:
1. A semiconductor device, comprising:
first and second bit line select switch arrays each having a plurality of bit line select switches; and
a sub-memory cell array adjacently disposed between the first and second bit line select line switch arrays and having a plurality of local bit lines, a plurality of word lines, and a plurality of memory cells disposed at intersections of the plurality of word lines and the plurality of local bit lines,
wherein the local bit lines are connected to a global bit line through the first and second bit line select switch arrays, and current is caused to flow through the first and second bit line select switch arrays in the same direction at the time of writing, and
wherein each said memory cell comprises
a select element and a resistance change element,
wherein one terminal of the select element is connected to a plate electrode shared by other memory cells and the other terminal thereof is connected to the resistance change element, and
wherein a potential of the plate electrode is set to a potential between a ground voltage and a memory cell writing voltage.

2. The semiconductor device according to claim 1, wherein the two bit line select switches connected to the local bit line are controlled by a common select line.

3. The semiconductor device according to claim 1, wherein information is written into the memory cell by resistance change.

4. The semiconductor device according to claim 1, wherein information is written into the memory cell by causing current to flow.

5. The semiconductor device according to claim 1, wherein the resistance change element is connected in series between the local bit line and the select element.

6. A semiconductor device, comprising:
first and second bit line/source line select switch arrays each constituted of a plurality of bit line select switches and a plurality of source line select switches; and
a sub-memory cell array adjacently disposed between the first and second bit line/source line select switch arrays and having a plurality of local bit lines, a plurality of local source lines, a plurality of word lines, and a plurality of memory cells disposed at intersections of the plurality of word lines, the plurality of local bit lines, and the plurality of local source lines,
wherein the local bit lines are connected to a global bit line in the first and second bit line/source line select switch arrays, and
the local source lines are connected to a global source line in the first and second bit line/source line select switch arrays.

7. The semiconductor device according to claim 6, wherein the bit line select switch and the source line select switch which connect the local bit line and the local source line connected to the memory cell to the global bit line and the global source line, respectively, are controlled by the same select line.

8. The semiconductor device according to claim 6, wherein the memory cell is constituted of a select element and a resistance change element,
one terminal of the select element is connected to the local source line and the other terminal thereof is connected to the resistance change element, and
the resistance change element is connected in series between the local bit line and the select element.

9. The semiconductor device according to claim 6, wherein the bit line select switch and the source line select switch are constituted of one MOS transistor, respectively.

10. The semiconductor device according to claim 6, wherein, when the bit line select switches connected to the local bit line are taken as first and second bit line select switches, and the source line select switches connected to the local source line are taken as the first and second source line select switches,
the first and second bit line select switches and the first and second source line select switches are turned ON at the time of writing, and
either one of a combination of the first bit line select switch and the second source line select switch or a combination of the second bit line select switch and the first source line select switch is turned ON depending on a selected word line at the time of reading.

11. The semiconductor device according to claim 6, wherein, when the bit line select switches connected to the local bit line are taken as first and second bit line select switches, and source line select switches connected to the local source line are taken as first and second source line select switches,
the first and second bit line select switches and the first and second source line select switches are turned ON at the time of reading, and
either one of a combination of the first bit line select switch and the second source line select switch or a combination of the second bit line select switch and the first source line select switch is turned ON depending on a selected word line at the time of writing.

12. A semiconductor device, comprising:
a first source line select switch array constituted of a plurality of first source line select switches;
a first bit line select switch array constituted of a plurality of first bit line select switches;
a first sub-memory cell array adjacently disposed between the first bit line select switch array and the first source line select switch array and having a plurality of first local bit lines, a plurality of first local source lines, a plurality of first word lines, and a plurality of first memory cells provided at intersections of the plurality of first word lines, the plurality of first local bit lines, and the plurality of first local source lines;
a second bit line select switch array disposed on an opposite side of the first sub-memory cell array with respect to the first bit line select switch array and constituted of a plurality of second bit line select switches;
a second source line select switch array disposed on an opposite side of the first sub-memory cell array with respect to the second bit line select switch array and constituted of a plurality of second source line select switches;
a second sub-memory cell array adjacently disposed between the second bit line select switch array and the second source line select switch array and having a plurality of second local bit lines, the plurality of first local source lines, a plurality of second word lines, and a plurality of second memory cells provided at intersections of the plurality of second word lines, the plurality of second local bit lines and the plurality of first local source lines;
a global bit line to which one ends of the plurality of first local bit lines are connected through the plurality of first bit line select switches, respectively, and one ends of the second local bit lines are connected through the plurality of second bit line select switches, respectively; and
a global source line to which one ends of the plurality of first local source lines are connected through the plurality of first source line select switches, respectively, and the other ends thereof are connected through the plurality of second source line select switches, respectively.

13. The semiconductor device according to claim 12, further comprising:
- a third source line select switch array disposed on an opposite side of the first sub-memory cell array with respect to the first source line select switch array and constituted of a plurality of third source line select switches;
- a third bit line select switch array disposed on an opposite side of the first sub-memory cell array with respect to the third source line select switch array and constituted of a plurality of third bit line select switches; and
- a third sub-memory cell array adjacently disposed between the third bit line select switch array and the third source line select switch array and having the plurality of first local bit lines, a plurality of second local source lines, a plurality of third word lines, and a plurality of third memory cells provided at intersections of the plurality of third word lines, the plurality of first local bit lines, and the plurality of second local source lines,
- wherein the other ends of the plurality of first local bit lines are connected to the global bit line in the plurality of third bit line select switches, respectively.

14. The semiconductor device according to claim 13,
wherein, of the plurality of first bit line select switches and the plurality of third bit line select switches, those connected to the same one of the plurality of first local bit lines are controlled by the same select line, and
of the plurality of first source line select switches and the plurality of second source line select switches, those connected to the same one of the plurality of first local source lines are controlled by the same select line.

15. The semiconductor device according to claim 13,
wherein, when writing is performed in one of the plurality of first memory cells, the first and third bit line select switches corresponding thereto are turned ON, and at the same time, the first and second source line select switches corresponding thereto are turned ON, and
when reading is performed from one of the plurality of first memory cells, depending on which one of the plurality of first word lines is to be selected, either of a first control in which the first bit line select switch and the first source line select switch corresponding thereto are turned ON or a second control in which the third bit line select switch and the second source line select switch corresponding thereto are turned ON is executed.

16. The semiconductor device according to claim 13,
wherein, when reading from one of the plurality of first memory cells is performed, the first and third bit line select switches corresponding thereto are turned ON, and at the same time, the first and second source line select switches corresponding thereto are turned ON, and
when writing to one of the plurality of first memory cells is performed, depending on which one of the plurality of first word lines is to be selected, either of a first control in which the first bit line select switch and the first source line select switch corresponding thereto are turned ON or a second control in which the third bit line select switch and the second source line select switch corresponding thereto are turned ON is executed.

17. The semiconductor device according to claim 12,
wherein the number of the plurality of first word lines and the number of the plurality of second word lines are equal.

18. The semiconductor device according to claim 12,
wherein each of the plurality of first memory cells has a first select element and a first resistance change element,
one terminal of the first select element is connected to the first local source line, and the other terminal thereof is connected to the first resistance change element, and
the first resistance change element is connected in series between the first local bit line and the first select element.

19. The semiconductor device according to claim 12,
wherein each of the plurality of first and second bit line select switches and the plurality of first and second source line select switches is formed of one MOS transistor.

* * * * *